(12) United States Patent
Fukuzumi et al.

(10) Patent No.: US 12,069,855 B2
(45) Date of Patent: Aug. 20, 2024

(54) SEMICONDUCTOR MEMORY

(71) Applicant: Kioxia Corporation, Tokyo (JP)

(72) Inventors: Yoshiaki Fukuzumi, Yokkaichi Mie (JP); Keisuke Suda, Yokkaichi Mie (JP); Fumiki Aiso, Kuwana Mie (JP); Atsushi Fukumoto, Mie Mie (JP)

(73) Assignee: Kioxia Corporation, Tokyo (JP)

( * ) Notice: Subject to any disclaimer, the term of this patent is extended or adjusted under 35 U.S.C. 154(b) by 113 days.

(21) Appl. No.: 17/524,984

(22) Filed: Nov. 12, 2021

(65) Prior Publication Data

US 2022/0077170 A1   Mar. 10, 2022

Related U.S. Application Data

(63) Continuation of application No. 16/291,347, filed on Mar. 4, 2019, now abandoned.

(30) Foreign Application Priority Data

Apr. 18, 2018 (JP) ................... 2018-079578

(51) Int. Cl.
*H10B 41/27* (2023.01)
*G11C 5/06* (2006.01)
*G11C 16/04* (2006.01)
*H10B 43/27* (2023.01)

(52) U.S. Cl.
CPC .............. *H10B 41/27* (2023.02); *G11C 5/06* (2013.01); *G11C 16/0408* (2013.01); *G11C 16/0466* (2013.01); *H10B 43/27* (2023.02)

(58) Field of Classification Search
CPC ............. H01L 29/7869; H01L 27/1225; H01L 29/78696; H01L 29/66969; H01L 2224/0401; H10B 43/27; H10B 43/10; H10B 41/27; H10B 43/35; H10B 43/40
See application file for complete search history.

(56) References Cited

U.S. PATENT DOCUMENTS

| | | | |
|---|---|---|---|
| 7,936,004 B2 | 5/2011 | Kito et al. | |
| 9,431,419 B2* | 8/2016 | Fukuzumi | .............. H10B 41/27 |
| 9,570,462 B2 | 2/2017 | Lee et al. | |
| 9,653,475 B1 | 5/2017 | Yoshimizu et al. | |
| 9,716,099 B2* | 7/2017 | Choi | .................. H01L 21/31144 |
| 10,304,852 B1* | 5/2019 | Cui | ........................ H10B 43/10 |
| 2016/0071741 A1 | 3/2016 | Imamura et al. | |
| 2017/0062459 A1 | 3/2017 | Yoshimizu et al. | |
| 2018/0323213 A1 | 11/2018 | Arai | |

* cited by examiner

*Primary Examiner* — Tony Tran
(74) *Attorney, Agent, or Firm* — Kim & Stewart LLP

(57) ABSTRACT

A semiconductor memory includes a substrate, a source line layer above the substrate in a memory region and a peripheral region of the substrate, a first insulating layer above the source line layer, a first conductive layer on the first insulating layer in the memory and peripheral regions, an alternating stack of a plurality of second insulating layers and a plurality of second conductive layers on the first conductive layer in the memory region, and a plurality of pillars extending through the alternating stack of the second insulating layers and the second conductive layers, the first conductive layer, and the first insulating layer in the memory region. A bottom end of each of the pillars is in the source line layer in a thickness direction. A carrier density of the source line layer is higher in the memory region than in the peripheral region.

18 Claims, 39 Drawing Sheets

SEMICONDUCTOR MEMORY

CROSS-REFERENCE TO RELATED APPLICATIONS

This application is a continuation of U.S. patent application Ser. No. 16/291,347, filed on Mar. 4, 2019, which is based upon and claims the benefit of priority from Japanese Patent Application No. 2018-079578, filed on Apr. 18, 2018, the entire contents of each of which are incorporated herein by reference.

FIELD

Embodiments described herein relate generally to a semiconductor memory.

BACKGROUND

As a semiconductor memory, a NAND flash memory is known.

DETAILED DESCRIPTION

Figure 1:
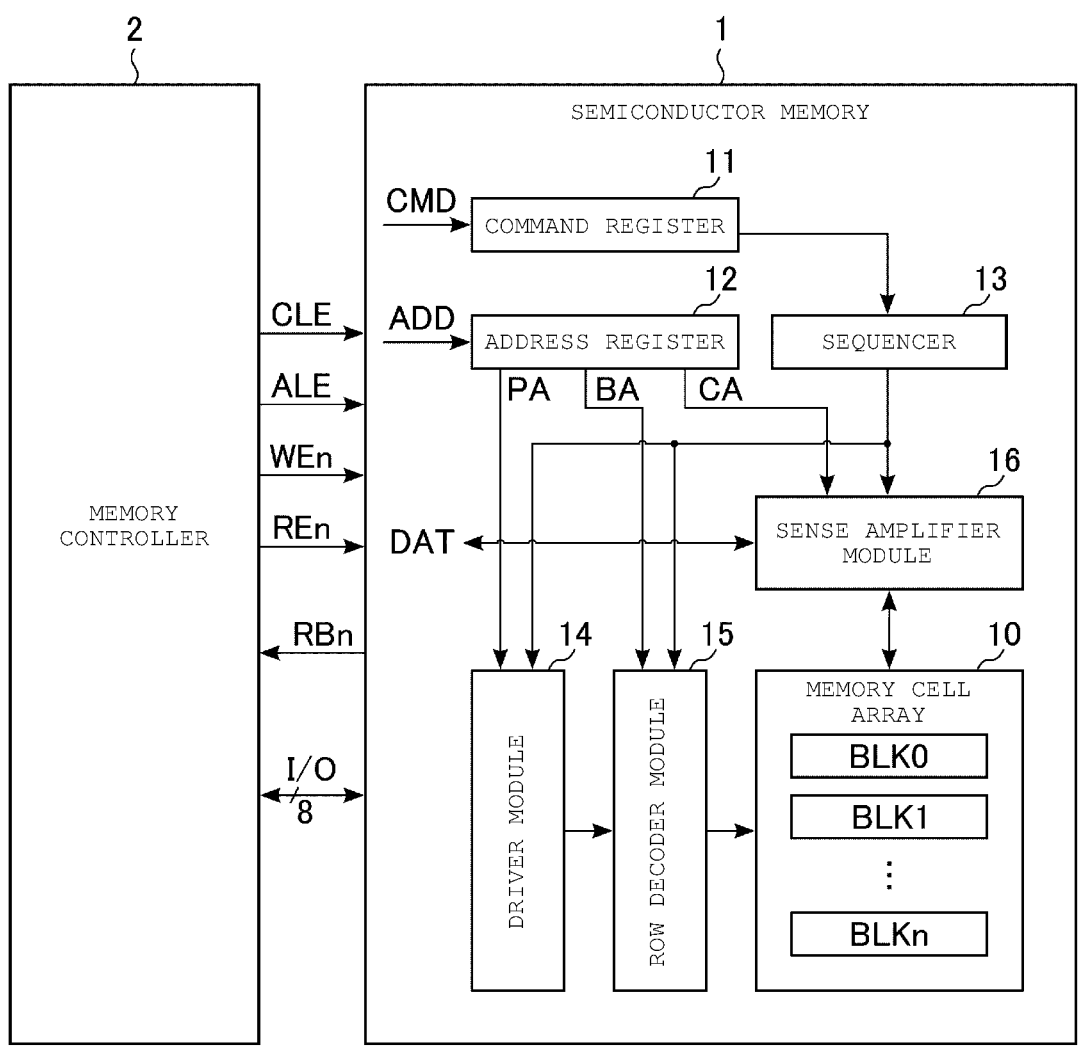
FIG. 1 is a block diagram illustrating a configuration example of a semiconductor memory according to a first embodiment.

One or more of embodiments are directed to increasing a yield of a semiconductor memory.

In general, according to an embodiment, a semiconductor memory includes a substrate, a source line layer above the substrate in a memory region and a peripheral region of the substrate, a first insulating layer above the source line layer in the memory and peripheral regions, a first conductive layer on the first insulating layer in the memory and peripheral regions, an alternating stack of a plurality of second insulating layers and a plurality of second conductive layers on the first conductive layer in the memory region, and a plurality of pillars extending through the alternating stack of the second insulating layers and the second conductive layers, the first conductive layer, and the first insulating layer in the memory region, a bottom end of each of the pillars being in the source line layer in a thickness direction. A carrier density of the source line layer in the memory region is higher than a carrier density of the source line layer in the peripheral region.

Hereinafter, embodiments will be described with reference to the drawings. Each embodiment exemplifies an apparatus and a method for embodying the technical idea of the present disclosure. The drawings are schematic or conceptual ones, and sizes and ratios of the drawings are not necessarily the same as actual ones. The technical idea of the present disclosure is not specified by the shape, structure, arrangement, and the like of structural elements.

In the following description, structural elements having substantially the same functions and configurations are denoted by the same reference numerals. The numerals after characters making up reference numerals are used to distinguish between elements having the same structure and referenced by the reference numerals including the same characters. When it is unnecessary to distinguish the elements denoted by the reference symbols including the same characters from each other, these elements are referenced by reference numerals including only characters.

[1] First Embodiment

Hereinafter, a semiconductor memory 1 according to a first embodiment will be described.

[1-1] Configuration of Semiconductor Memory 1

[1-1-1] Overall Configuration of Semiconductor Memory 1

The semiconductor memory 1 is a NAND flash memory capable of storing data in a nonvolatile manner, for example. The semiconductor memory 1 is controlled by, for example, an external memory controller 2. FIG. 1 illustrates a configuration example of the semiconductor memory 1 according to the first embodiment.

As illustrated in FIG. 1, the semiconductor memory 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer of 1 or more). In the memory cell array 10, a plurality of bit lines and a plurality of word lines are provided. The block BLK is a group of nonvolatile memory cells and is used as, for example, a unit of data erasure. Each memory cell is associated with one bit line and one word line. A detailed configuration of the memory cell array 10 will be described below.

The command register 11 stores a command CMD received by the semiconductor memory 1 from the memory controller 2. The command CMD includes, for example, an instruction to cause the sequencer 13 to execute a read operation, a write operation, an erasing operation, and the like.

The address register 12 stores address information ADD received from the memory controller 2 by the semiconductor memory 1. The address information ADD includes, for example, a block address BA, a page address PA, and a column address CA. The block address BA, the page address PA, and the column address CA are used to select the block BLK, the word line, and the bit line, respectively.

The sequencer 13 controls an operation of the entire semiconductor memory 1. For example, the sequencer 13 controls the driver module 14, the row decoder module 15, and the sense amplifier module 16 based on the command CMD stored in the command register 11 to execute the read operation, the write operation, the erasing operation, and the like.

The driver module 14 generates a voltage to be used for the read operation, the write operation, the erasing operation, and the like. Then, based on the page address PA stored in the address register 12, the driver module 14 applies generated voltages respectively to a signal line corresponding to a selected word line and to a signal line corresponding to a non-selected word line.

The row decoder module 15 selects one block BLK based on the block address BA stored in the address register 12. Then, for example, the row decoder module 15 transfers the voltages applied to the signal line corresponding to the selected word line and the signal line corresponding to the non-selected word line to the selected word line and the non-selected word line in the selected block BLK, respectively.

In the write operation, the sense amplifier module 16 applies a desired voltage to each bit line in accordance with write data DAT received from the memory controller 2. In the read operation, the sense amplifier module 16 determines data stored in the memory cell based on the voltage of the bit line, and transfers the determination result to the memory controller 2 as read data DAT.

Communication between the semiconductor memory 1 and the memory controller 2 supports, for example, the NAND interface standard. For example, in the communication between the semiconductor memory 1 and the memory controller 2, a command latch enable signal CLE, an address latch enable signal ALE, a write enable signal WEn, a read enable signal REn, a ready busy signal RBn, and an input and output signal I/O used.

The command latch enable signal CLE is a signal indicating that the input and output signal I/O received by the semiconductor memory 1 is the command CMD. The address latch enable signal ALE is a signal indicating that the signal I/O received by the semiconductor memory 1 is address information ADD. The write enable signal WEn is a signal instructing the semiconductor memory 1 to input the input and output signal I/O. The read enable signal REn is a signal instructing the semiconductor memory 1 to output the input and output signal I/O.

The ready busy signal RBn is a signal for notifying the memory controller 2 whether the semiconductor memory 1 is in a ready state for the semiconductor memory 1 to receive an instruction from the memory controller 2 or in a busy state in which an instruction is not received. The input and output signal I/O is, for example, an 8-bit width signal and may include the command CMD, the address information ADD, the data DAT, and the like.

The semiconductor memory 1 and the memory controller 2 described as above may be combined into to configure a single semiconductor device. Examples of such a semiconductor device include a memory card such as an SD™ card, a solid state drive (SSD), and the like.

[1-1-2] Circuit Configuration of Memory Cell Array 10

Figure 2:
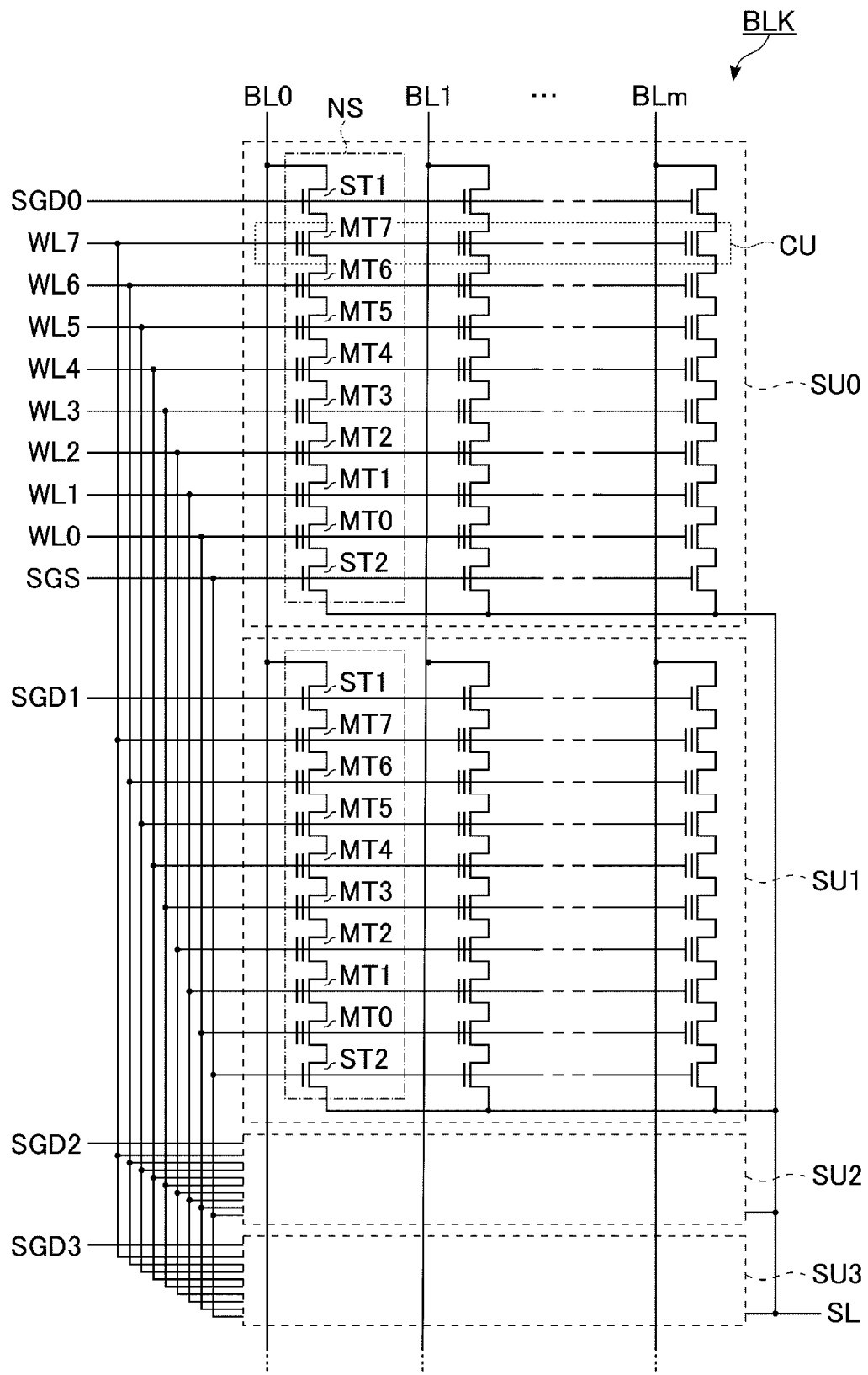
FIG. 2 is a circuit diagram illustrating an example of a circuit configuration of a memory cell array in the semiconductor memory according to the first embodiment.

FIG. 2 illustrates an example of a circuit configuration of the memory cell array 10 in the semiconductor memory 1 according to the first embodiment by extracting one block BLK out of a plurality of the blocks BLKs in the memory cell array 10.

As illustrated in FIG. 2, the block BLK includes, for example, four string units SU0 to SU3. Each string unit SU includes a plurality of NAND strings NS respectively associated with bit lines BL0 to BLm (m is an integer of 1 or more).

Each NAND string NS includes, for example, eight memory cell transistors MT0 to MT7 and select transistors ST1 and ST2.

The memory cell transistor MT includes a control gate and a charge storage layer, and stores data in a nonvolatile manner. Each of the select transistors ST1 and ST2 is used for selecting the string unit SU during various operations.

In each NAND string NS, the memory cell transistors MT0 to MT7 are connected in series between a source of a select transistor ST1 and a drain of a select transistor ST2. Control gates of the memory cell transistors MT0 to MT7 in the same block BLK are jointly connected to word lines WL0 to WL7, respectively.

Gates of the select transistors ST1 in each of the string units SU0 to SU3 in the same block BLK are jointly connected to the select gate lines SGD0 to SGD3, respectively. Drains of the select transistors ST1 corresponding to the same column among the plurality of blocks BLK are jointly connected to the corresponding bit lines BL.

Gates of the select transistors ST2 in the same block BLK are jointly connected to a select gate line SGS. Sources of the select transistors ST2 in each block BLK are jointly connected to a source line SL among the plurality of blocks BLK.

A plurality of memory cell transistors MT connected to a common word line WL in one string unit SU is referred to as a cell unit CU, for example. A storage capacity of each cell unit CU changes based on the number of bits of data stored in the memory cell transistor MT.

For example, one cell unit CU stores one page of data when each of the memory cell transistors MT stores one bit data, and stores two pages of data when each of the memory cell transistors MT stores 2-bit data.

The "one page of data" is defined by the total amount of data stored in the cell unit CU including the memory cell transistors MT each of which stores 1-bit data, for example.

[1-1-3] Structure of Memory Cell Array 10

In the following, an example of a structure of the memory cell array 10 in the semiconductor memory 1 according to the first embodiment will be described.

In the drawings referenced below, the X-direction corresponds to an extending direction of the word line WL, the Y-direction corresponds to an extending direction of the bit line BL, and the Z-direction corresponds to the vertical direction with respect to the surface of the semiconductor substrate 20 on which the semiconductor memory 1 is formed. In order to make figures easy to see, hatching is appropriately added to each structural element in a plan view. The hatching added to the plan view is not necessarily related to the material or characteristics of the hatched structural element. In the cross-sectional view, structural elements such as an insulating layer (interlayer insulating film), interconnection, contact, and the like are appropriately omitted.

Figure 3:
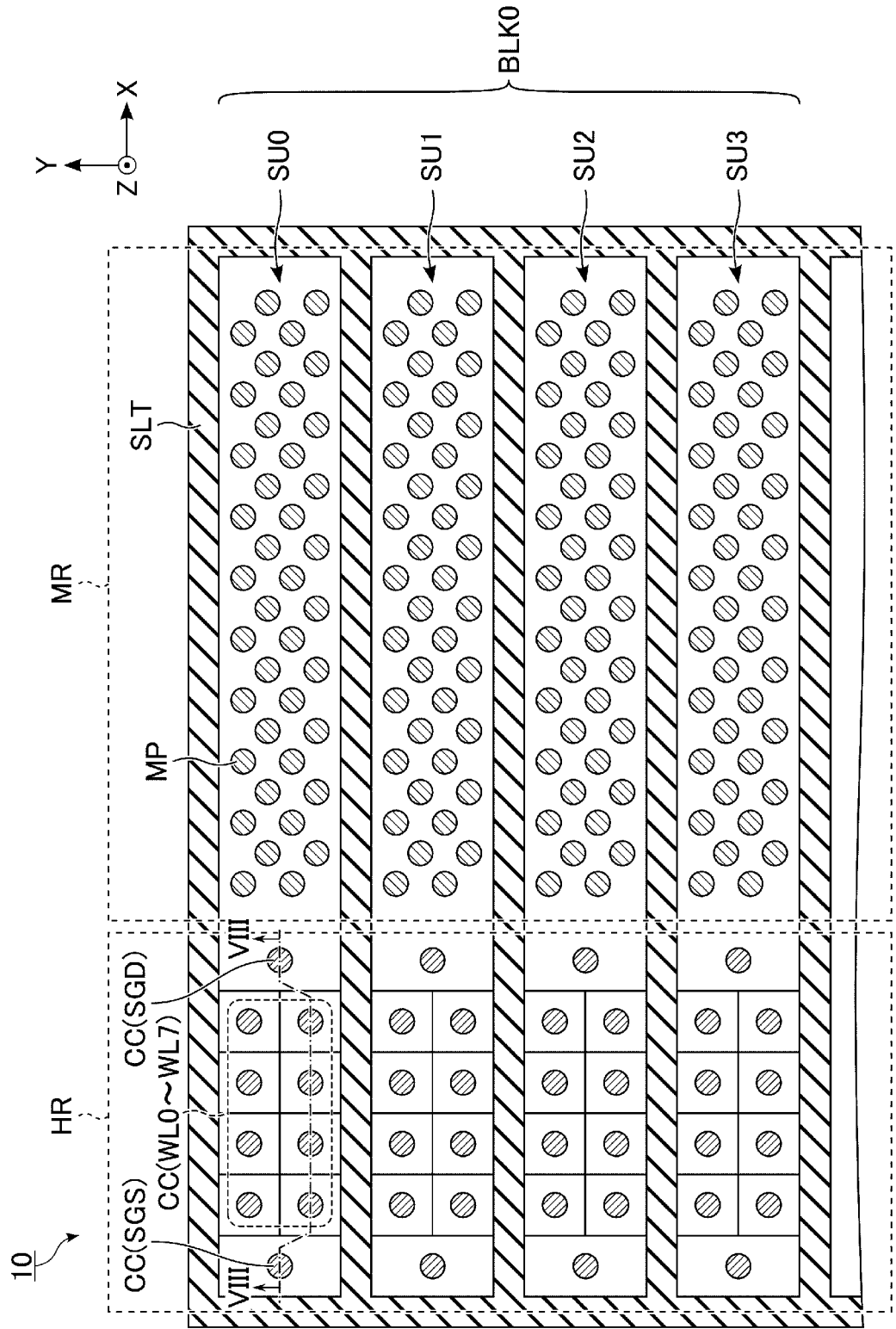
FIG. 3 illustrates a plan view of an example of a planar layout of the memory cell array in the semiconductor memory according to the first embodiment.

FIG. 3 illustrates an example of a planar layout of the memory cell array 10 according to the first embodiment by extracting a structure corresponding to the block BLK0 out of a plurality of blocks BLK arranged in the Y-direction.

As illustrated in FIG. 3, for example, each of the structures corresponding to the string units SU0 to SU3 of the block BLK0 extends in the X-direction, and they are arranged in the Y-direction. Structures corresponding to the string units SU0 to SU3 are surrounded by slits SLT, respectively. That is, between the string units SU adjacent in the Y-direction, a slit SLT extending in the X-direction is provided.

In other words, a plurality of slits SLT extending in the X-direction are arranged in the Y-direction. Two slits SLT extending in the Y-direction connect end portions on one side in the X-direction of the plurality of slits SLT extending in the X-direction and connect the other end portions, respectively. The structure formed by two slits SLT extending in the Y-direction and the slits SLT adjacent in the Y-direction corresponds to one string unit SU. In such regions surrounded by the slits SLT, a plurality of string units SU may be provided.

A region in which a structure corresponding to the string unit SU is provided is classified into a memory region MR and a drawing region HR. First, a detailed structure in the memory region MR of the string unit SU will be described.

The memory region MR is a region in which data is stored. In the memory region MR, a plurality of memory pillars MP are provided, for example, in a zigzag manner. Each of the memory pillars MP functions as, for example, one NAND string NS. The number of memory pillars MP illustrated in FIG. 3 is a schematic one, and the number of memory pillars MP is not limited to the number in this diagram.

Figure 4:
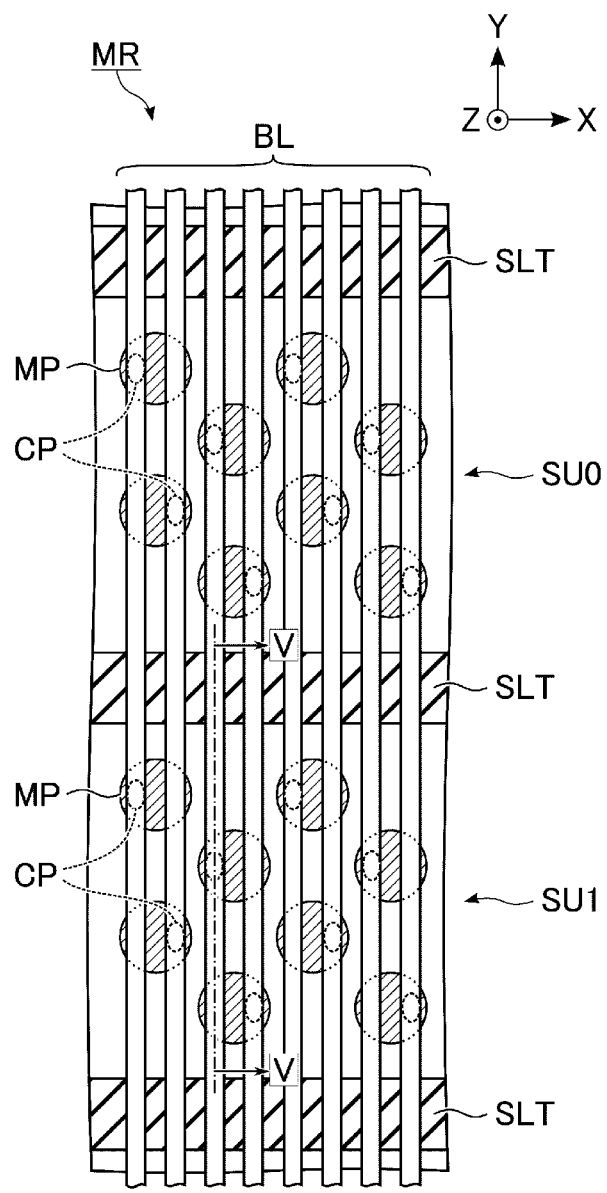
FIG. 4 illustrates a plan view of an example of a more detailed planar layout of the memory cell array in the semiconductor memory according to the first embodiment.

FIG. 4 illustrates an example of a detailed planar layout in the memory region MR of the memory cell array 10 according to the first embodiment, extracting structures respectively corresponding to the string units SU0 and SU1.

As illustrated in FIG. 4, in the memory cell array 10, the plurality of bit lines BL and the plurality of contacts CP are arranged corresponding to the positions of the memory pillar MP, respectively.

Each of the plurality of bit lines BL extends in the Y-direction, and the plurality of bit lines BL are arranged in the X-direction. For example, two bit lines BL overlap each memory pillar MP. The number of bit lines BL overlapping each memory pillar MP may be any number.

Each contact CP is provided between the corresponding bit line BL and memory pillar MP. Each memory pillar MP is electrically connected to one bit line through the contact CP. When a plurality of bit lines BL overlap one memory pillar MP, a contact CP is provided between one of the bit lines BL overlapping the memory pillar MP and the memory pillar MP.

Figure 5:
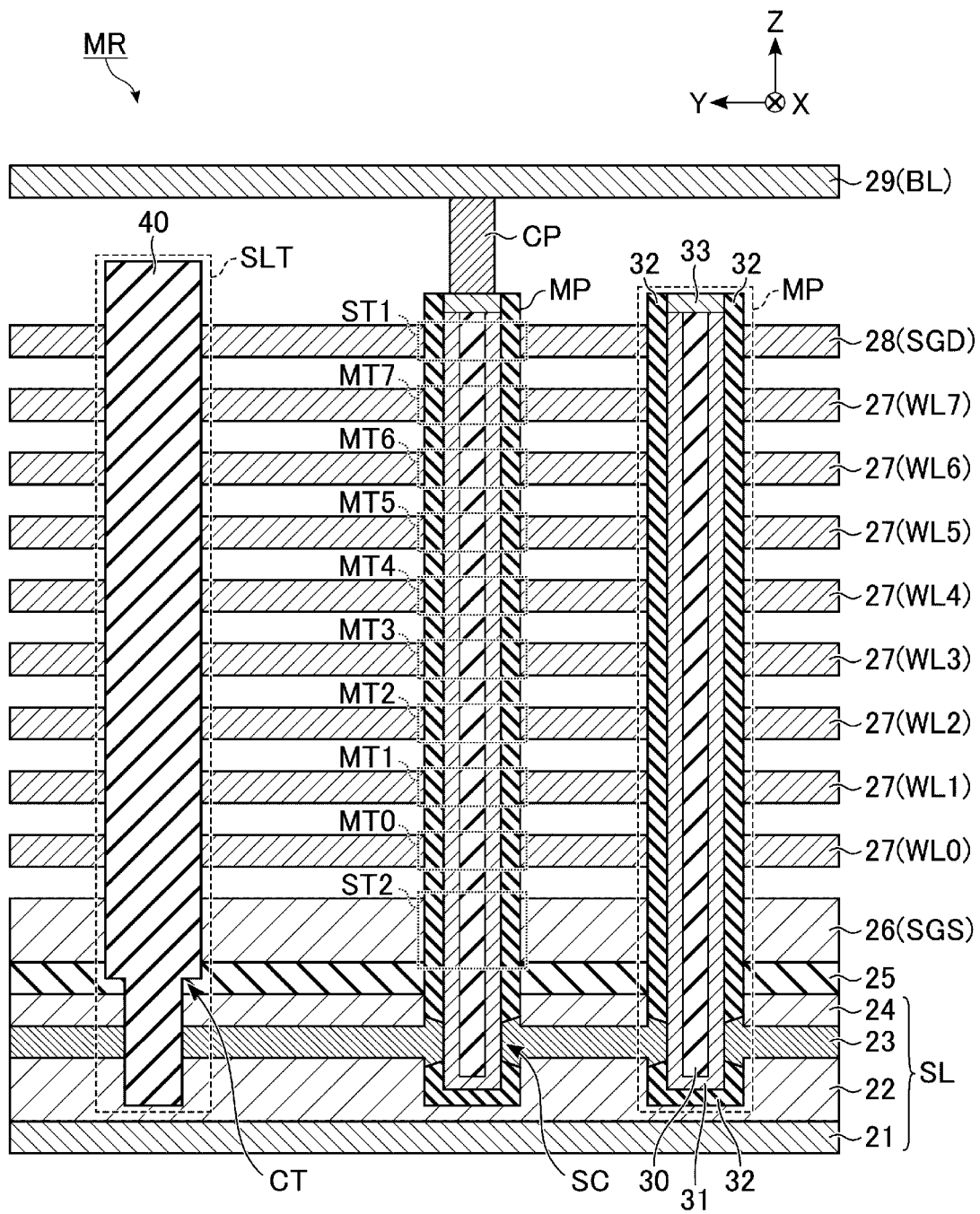
FIG. 5 illustrates a cross-sectional view of an example of a cross-sectional structure of the memory cell array taken along line V-V in FIG. 4.

FIG. 5 illustrates a cross-sectional view of the memory cell array 10 taken along the line V-V of FIG. 4, and illustrates an example of a cross-sectional structure in the memory region MR of the memory cell array 10 in the first embodiment.

As illustrated in FIG. 5, in the memory region MR, the memory cell array 10 includes, for example, a conductor 21, conductors 22 to 24, an insulating layer 25, conductors 26 to 29, the memory pillars MP, the contact CP, and the slit SLT.

The conductor 21 is provided above the semiconductor substrate 20 with an insulating layer interposed therebetween. The conductor 21 is formed in a plate shape enlarging along the XY-plane, for example. The conductor 21 contains, for example, tungsten (W). In the region between the semiconductor substrate 20 and the conductor 21, for example, circuits such as the row decoder module 15 and the sense amplifier module 16 are provided (not illustrated).

The conductor 22 is provided on the conductor 21. The conductor 23 is provided on the conductor 22. The conductor 24 is provided on the conductor 23. Each of the conductors 22 to 24 is formed in a plate shape extending along the XY-plane, for example.

The respective conductors 21 to 24 are electrically connected to each other. A set of the conductors 21 to 24 is used as a source line SL. Hereinafter, the set of the conductors 21 to 24 will be referred to as a source line portion.

Each of the conductors 22 and 24 is, for example, non-doped polysilicon (Si). The conductor 23 is, for example, phosphorus doped polysilicon (Si).

On the conductor 24, the insulating layer 25 is provided. The insulating layer 25 includes an insulator such as silicon dioxide ($SiO_2$), for example.

On the insulating layer 25, the conductor 26 is provided. The conductor 26 is formed in a plate shape enlarging along the XY-plane, for example. The conductor 26 is used as the select gate line SGS, for example. The conductor 26 is, for example, phosphorus doped polysilicon (Si).

On the conductor 26, an insulating layer and the conductor 27 are alternately stacked. The conductor 27 is formed in a plate shape enlarging along the XY-plane, for example. The plurality of stacked conductors 27 are used as word lines WL0 to WL7 in order from the semiconductor substrate 20 side. The conductor 27 contains tungsten (W), for example.

The conductor 28 is provided on the uppermost conductor 27 through an insulating layer. The conductor 28 is formed in a plate shape enlarging along the XY-plane, for example. The conductor 28 is used as the select gate line SGD, for example. The conductor 28 includes tungsten (W), for example.

The conductor 29 is provided on the conductor 28 with an insulating layer interposed therebetween. The conductor 29 is formed in a line shape extending along the Y-direction. The conductor 29 is used as the bit line BL. That is, the plurality of conductors 29 are arranged along the X-direction in a region (not illustrated). The conductor 29 contains copper (Cu), for example.

The memory pillar MP is formed in a columnar shape extending along the Z-direction and penetrates, for example, the conductors 23 and 24, the insulating layer 25, the conductor 26, the plurality of conductors 27, and the conductor 28.

The upper end of the memory pillar MP is included in a layer between a layer provided with the conductor 28 and a layer provided with the conductor 29.

The lower end of the memory pillar MP is included in the layer provided with the conductor 22, for example. In other words, the bottom surface of the memory pillar MP stops without passing through the conductor 22.

The memory pillar MP includes, for example, a core member 30, a semiconductor 31, a stacked film 32, and a conductor 33.

The core member 30 is formed in a columnar shape extending along the Z-direction. The upper end of the core member 30 is included in a layer between, for example, a layer provided with the conductor 28 and a layer provided with the conductor 29. The lower end of the core member 30 is included, for example, in the layer provided with the conductor 22. The core member 30 includes an insulator such as silicon dioxide ($SiO_2$), for example.

The side surfaces and the lower surface of the core member 30 are covered with the semiconductor 31. The semiconductor 31 has a side surface contact portion SC. The side surface contact portion SC is included in the layer provided with the conductor 23. The semiconductor 31 contacts the conductor 23 at the side surface contact portion SC and is electrically connected to the conductor 23. The semiconductor 31 is polysilicon (Si), for example.

Figure 6:
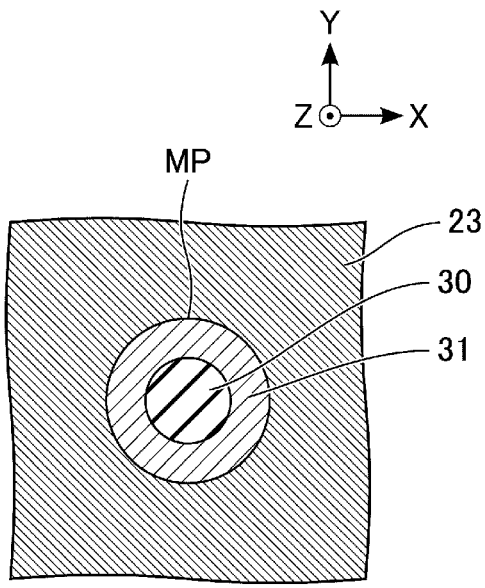
FIG. 6 illustrates a cross-sectional view of an example of a cross-sectional structure of a memory pillar provided in the memory cell array in the semiconductor memory according to the first embodiment.

An example of the structure of the memory pillar MP in the cross-section including the conductor 23 and parallel to the surface of the semiconductor substrate 20 is illustrated in FIG. 6.

As illustrated in FIG. 6, the core member 30 is provided in the central portion of the memory pillar MP in the layer including the conductor 23. The semiconductor 31 surrounds the core member 30. The conductor 23 is in contact with side surfaces (side surface contact portion SC) of the semiconductor 31.

Returning to FIG. 5, the side surfaces and the bottom surface of the semiconductor 31 are covered with the stacked film 32. In the vicinity of the side surface contact portion SC, the stacked film 32 is not provided. Between the stacked film 32 provided in the vicinity of the side surface contact portion SC of the memory pillar MP, that is, provided at the upper portion of the memory pillar MP, and the stacked film 32 provided at the lower portion of the memory pillar MP, the conductor 23 is provided as described above.

Figure 7:
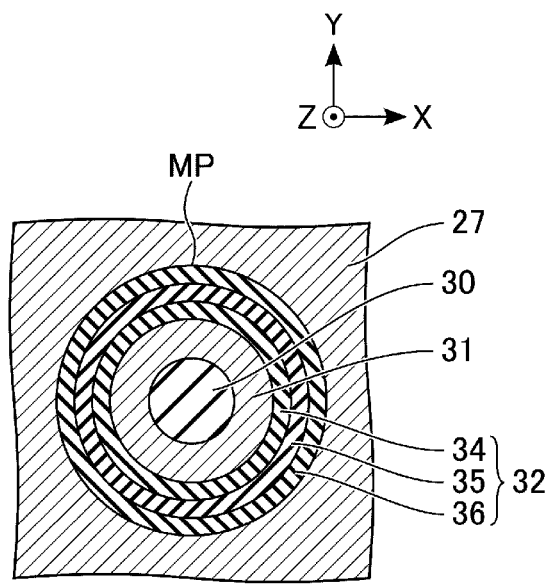
FIG. 7 illustrates another cross-sectional view of the example of the cross-sectional structure of the memory pillar provided in the memory cell array in the semiconductor memory according to the first embodiment.

An example of the structure of the memory pillars MP in the cross-section including the conductors 27 used as word lines WL and parallel to the surface of the semiconductor substrate 20 is illustrated in FIG. 7.

As illustrated in FIG. 7, the core member 30 is provided in the central portion of the memory pillar MP in the layer including the conductor 27. The semiconductor 31 surrounds the side surfaces of the core member 30. The stacked film 32 surrounds the side surfaces of the semiconductor 31. The stacked film 32 includes, for example, a tunnel oxide film 34, an insulating film 35, and a block insulating film 36.

The tunnel oxide film 34 is in contact with the semiconductor 31 and surrounds the side surface of the semiconductor 31. The insulating film 35 is in contact with the tunnel oxide film 34 and surrounds the side surfaces of the tunnel oxide film 34. The block insulating film 36 is in contact with the insulating film 35 and surrounds the side surfaces of the insulating film 35. The conductor 27 is in contact with the block insulating film 36 and surrounds the side surfaces of the block insulating film 36.

Returning to FIG. 5 again, the conductor 33 is formed on the core member 30 and the semiconductor 31. The conductor 33 is electrically connected to the semiconductor 31. The side surfaces of the conductor 33 are covered with the stacked film 32, for example. The conductor 33 is, for example, polysilicon (Si) and may be formed integrally with the semiconductor 31.

In the configuration of the memory pillar MP described above, for example, a portion where the memory pillar MP and the conductor 26 cross each other functions as the select transistor ST2. Portions where the memory pillars MP and the plurality of conductors 27 cross each other function as the memory cell transistors MT0 to MT7, respectively. A portion where the memory pillar MP and the conductor 28 cross each other functions as the select transistor ST1.

That is, the semiconductor 31 functions as a channel of the memory cell transistor MT and each of the select transistors ST1 and ST2. The insulating film 35 functions as a charge storage layer of the memory cell transistor MT.

The memory pillar MP may have a structure in which a plurality of pillars are connected in the Z-direction. For example, the memory pillar MP may have a structure in which a pillar passing through the conductor 28 (select gate line SGS) and a pillar passing through the plurality of conductors 27 (word lines WL) are connected. In addition, the memory pillar MP may have a structure in which a plurality of pillars each passing through the plurality of conductors 27 are connected in the Z-direction.

On the conductor 33 of the memory pillar MP, the columnar contact CP is provided. One conductor 29, that is, one bit line BL, is in contact with the upper surface of the contact CP. The memory pillar MP and the conductor 29 may be electrically connected through two or more contacts or may be electrically connected through wiring.

The slit SLT is formed in a plate shape extending along the Z-direction, and divides, for example, the conductors 23 and 24, the insulating layer 25, the conductor 26, the plurality of conductors 27, and the conductor 28. For that reason, in the semiconductor memory 1 according to the first embodiment, the conductor 26, the conductor 27, and the conductor 28 all have a shape extending in the X-direction.

The upper end of the slit SLT is included in a layer between the layer provided with the conductor 28 and the layer provided with the conductor 29. The lower end of the slit SLT is included in, for example, the layer provided with the conductor 22. In other words, the bottom surface of the slit SLT stops without passing through the conductor 22. However, it suffices that the slits SLT divide at least the conductors 26 to 28.

In addition, the slit SLT includes a step portion CT, and the step portion CT is a boundary between different widths of the slit. Specifically, the step portion CT is included in the insulating layer 25, for example. The slit width in the below the step portion CT is narrower than the slit width above the step portion CT.

An insulator 40 is provided inside the slit SLT. The insulator 40 includes an insulator such as silicon dioxide ($SiO_2$), for example. The insulator 40 may be formed of plural kinds of insulators. For example, silicon nitride (SiN) may be formed as a side wall of the slit SLT before silicon dioxide is embedded in the slit SLT.

Next, returning to FIG. 3, a detailed structure in the drawing region HR of the string unit SU will be described.

The drawing region HR is a region for connecting the wiring connected to the NAND strings NS provided in the memory region MR and the row decoder module 15s.

In the drawing region HR, a plurality of conductors respectively corresponding to the select gate line SGS, the word lines WL0 to WL7, and the select gate line SGD are provided, for example, in a stepwise shape. In the example illustrated in FIG. 3, end portions of the conductors corresponding to the word lines WL are provided in two rows of stepwise shapes.

In the drawing region HR, contacts CC are provided corresponding to, for example, the select gate line SGS, the word lines WL0 to WL7, and the select gate line SGD, respectively. Each of the select gate line SGS, the word lines WL0 to WL7, and the select gate line SGD is electrically connected to the row decoder module 15 through the corresponding contact CC.

Figure 8:
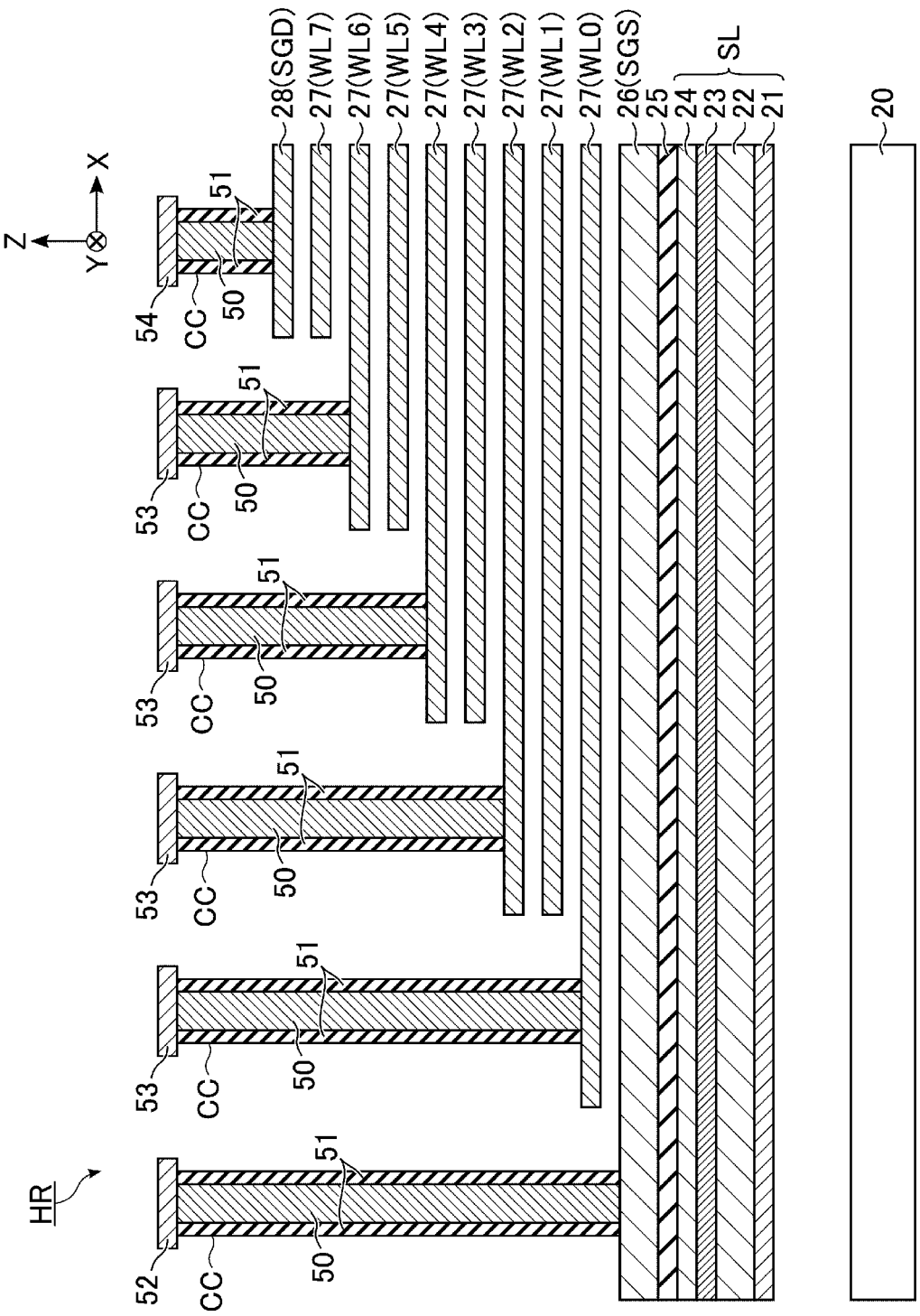
FIG. 8 illustrates a cross-sectional view of an example of the cross-sectional structure of the memory cell array taken along line VIII-VIII of FIG. 3.

FIG. 8 illustrates a cross-sectional view of the memory cell array 11 taken along line VIII-VIII in FIG. 3 and illustrates an example of a cross-sectional structure of the memory cell array 10 in the drawing region HR in the first embodiment. In the region illustrated in FIG. 8, configurations corresponding respectively to the select gate line SGS, the word lines WL0, WL2, WL4, and WL6, and the select gate line SGD are displayed.

As illustrated in FIG. 8, in the drawing region HR, the memory cell array 10 includes, for example, conductors 21 to 24 and 26, conductors 27 and 28, a plurality of contacts CC, and conductors 52 to 54.

For example, the end portions of the conductors 26, the conductors 27, and the conductors 28 corresponding respectively to the select gate line SGS, the word line WL, and the select gate line SGD are provided in the stepwise shape as described above. Not limited to the stepwise shape, it is sufficient that in the drawing region HR, each of end portions of the conductors 26 to 28 has a portion which does not overlap at least the conductors 27 or 28 provided in the layers above.

Each contact CC is formed in a columnar shape extending along the Z-direction and includes, for example, a conductor 50 and a spacer 51. The conductor 50 is formed in a columnar shape extending from the upper surface to the lower surface of the contact CC. The spacer 51 is formed on the side surface of the conductor 50 and formed into a cylindrical shape. In other words, the side surfaces of the conductor 50 are covered with the spacer 51. The conductor 50 contains tungsten (W), for example. The spacer 51 includes an insulator such as silicon nitride (SiN), for example.

Each of the conductors 52 to 54 is a wiring for connecting between various wirings led out from the memory region MR to the drawing region HR and the row decoder module 15. The conductor 52 is provided corresponding to the conductor 26. Each of the plurality of conductors 53 is provided corresponding to the plurality of conductors 27. The conductor 54 is provided corresponding to the conductor 28.

A contact CC is provided on the end portion of the conductor 26, and the conductor 52 is provided on the contact CC. Contacts CC are provided on the end portions of the plurality of conductors 27, respectively, and conductors 53 are provided on the plurality of contacts CC, respectively. A contact CC is provided on the end portion of the conductor 28, and the conductor 54 is provided on the contact CC.

Each of the conductors 52 to 54 described above is electrically connected to the row decoder module 15 in a region that is not illustrated. The layers in which the conductors 52 to 54 are formed may be the same or different. The end portions of the conductor 26 and the conductors 27 and 28 and the corresponding conductors 52 to 54 may be electrically connected to each other through two or more contacts or may be electrically connected to each other through other wiring.

In the structure of the memory cell array 10 described above, the number of conductors 27 is designed based on the number of word lines WL. A plurality of conductors 26 provided in a plurality of layers may be allocated to the select gate line SGS. When the select gate line SGS is provided in a plurality of layers, conductors different from the conductors 26 may be used. A plurality of conductors 28 provided in a plurality of layers may be allocated to the select gate line SGD.

In this specification, the structure in which the slit SLT divides the conductors 27 and 28 is exemplified, but the slit SLT need not divide the conductor 28. In this case, the memory pillar MP has a structure in which a plurality of pillars are connected in the Z-direction, a pillar provided at the lower portion penetrates the conductor 27, and a pillar provided at the upper portion penetrates the conductor 28. In addition, the conductor 28 is divided by a slit different from the slit SLT, and each of the plurality of divided conductors 28 functions as a select gate line SGD.

[1-2] Manufacturing Method of Semiconductor Memory 1

Figure 9:
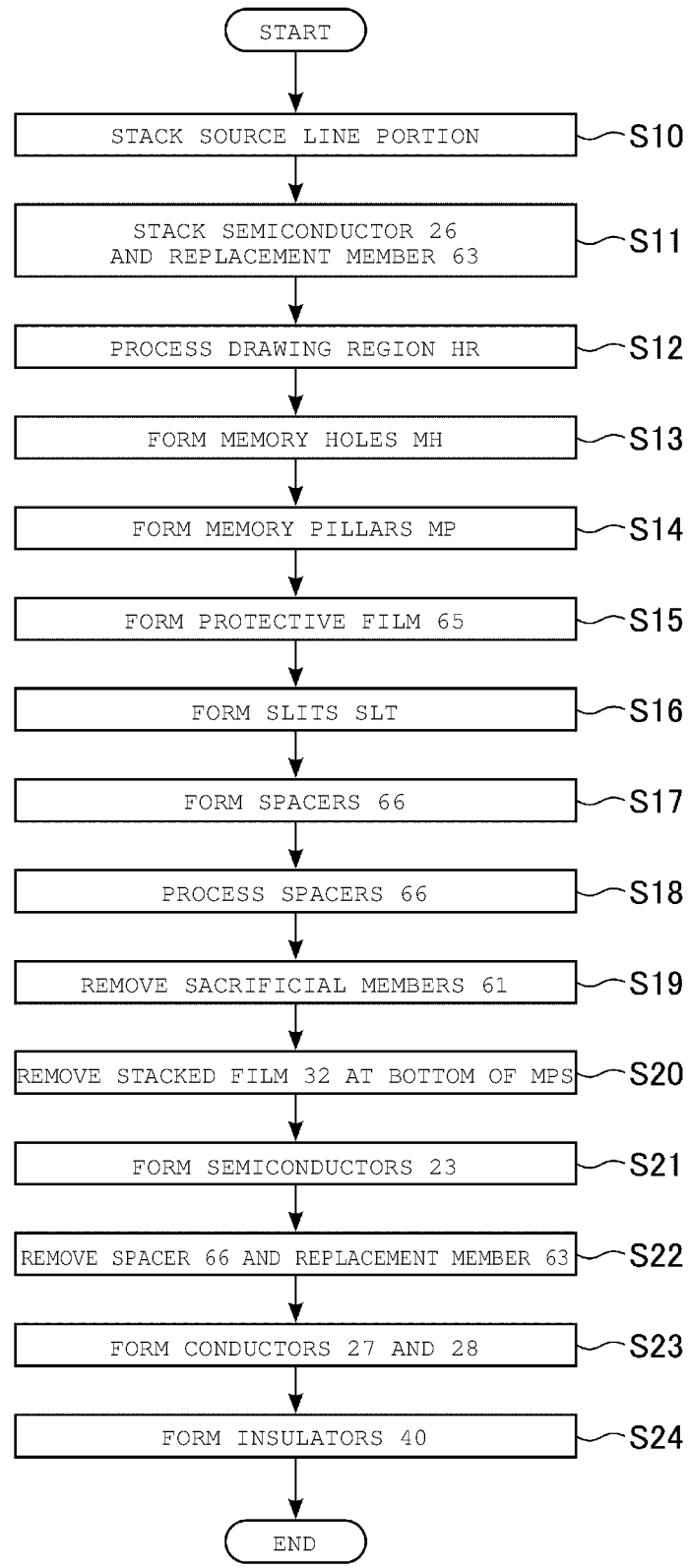
FIG. 9 is a flowchart illustrating an example of a method for manufacturing the semiconductor memory according to the first embodiment.

FIG. 9 is a flowchart illustrating an example of a method for manufacturing the semiconductor memory 1 according to the first embodiment. Each of FIGS. 10 to 24 illustrates an example of a cross-sectional structure of a structure formed in the memory region MR in a manufacturing process of the semiconductor memory 1 according to the first embodiment.

In the following, with reference to FIG. 9 and any of FIGS. 10 to 24, an example of a method for manufacturing the semiconductor memory 1 will be described by extracting a series of processes from formation of the source line portion to formation of the slit SLT.

A peripheral region PR illustrated in the cross-sectional view referenced below corresponds to a region away from the slit SLT in the memory cell array 10 described with reference to FIG. 3. In the semiconductor memory 1 according to the first embodiment, for example, a contact penetrating the memory cell array 10 and electrically connected to a circuit on the semiconductor substrate 20 is formed in the peripheral region PR.

Figure 10:
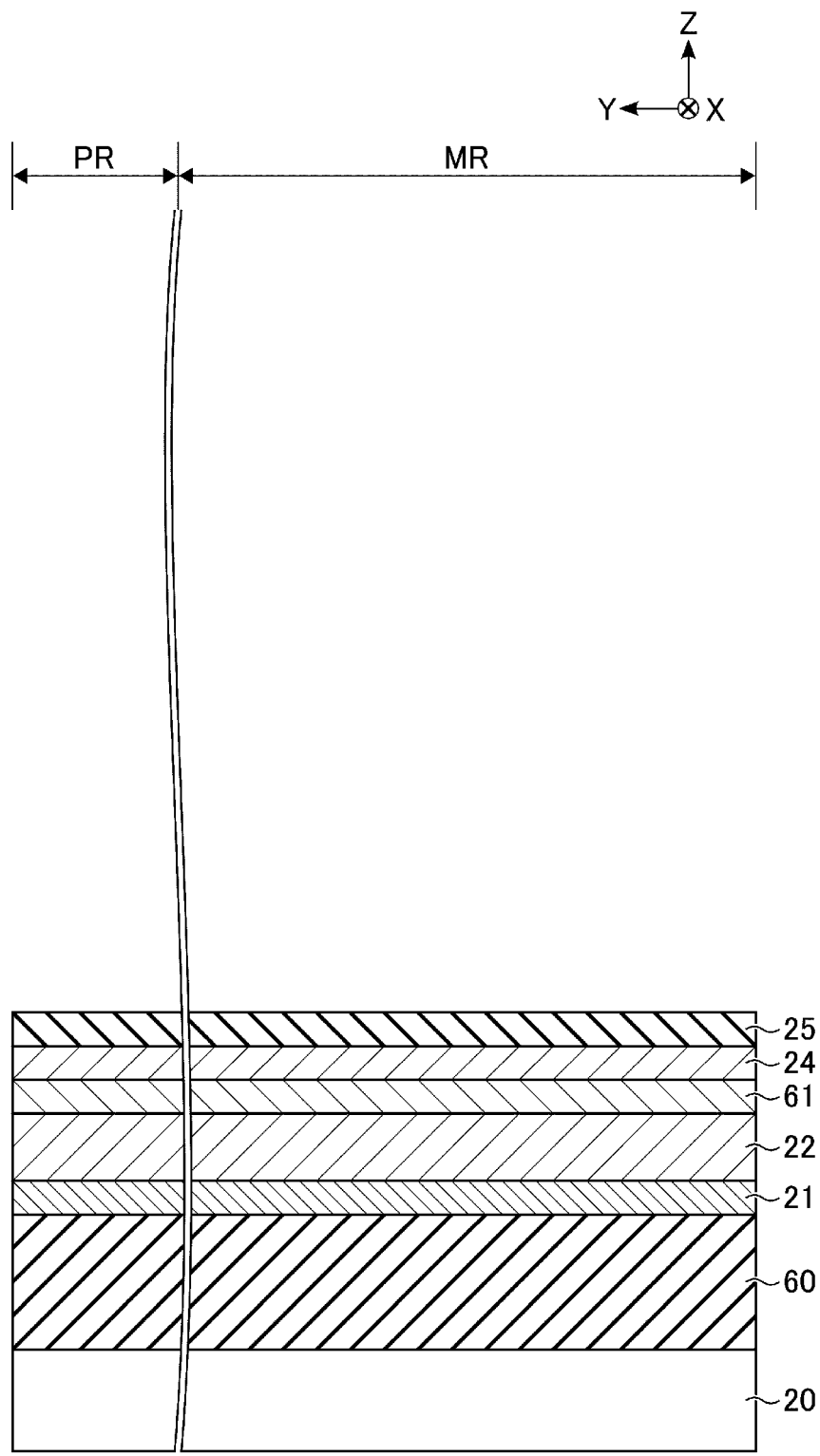
FIGS. 10-24 illustrate a cross-sectional view of a memory cell array to illustrate an example of a manufacturing process of the semiconductor memory according to the first embodiment.

First, as illustrated in FIG. 10, the source line portion is stacked (Step S10).

Specifically, the interlayer insulating film 60 is formed on the semiconductor substrate 20, and the conductor 21 is formed on the interlayer insulating film 60. Then, the conductor 22, a sacrificial member 61, the conductor 24, and the insulating layer 25 are stacked in order on the conductor 21. Before the conductor 21 is formed, a circuit (not illustrated) is formed in the semiconductor substrate 20 and the interlayer insulating film 60.

As the sacrificial member 61, a material capable of increasing an etching selection ratio with respect to each of the conductors 22 and 24 is selected. The sacrificial member 61 is, for example, a semiconductor containing germanium (Ge), that is, silicon germanium (SiGe). In this example, it is assumed that each of the conductors 22 and 24 is a non-doped polysilicon film and the sacrificial member 61 is a silicon germanium film.

Figure 11:
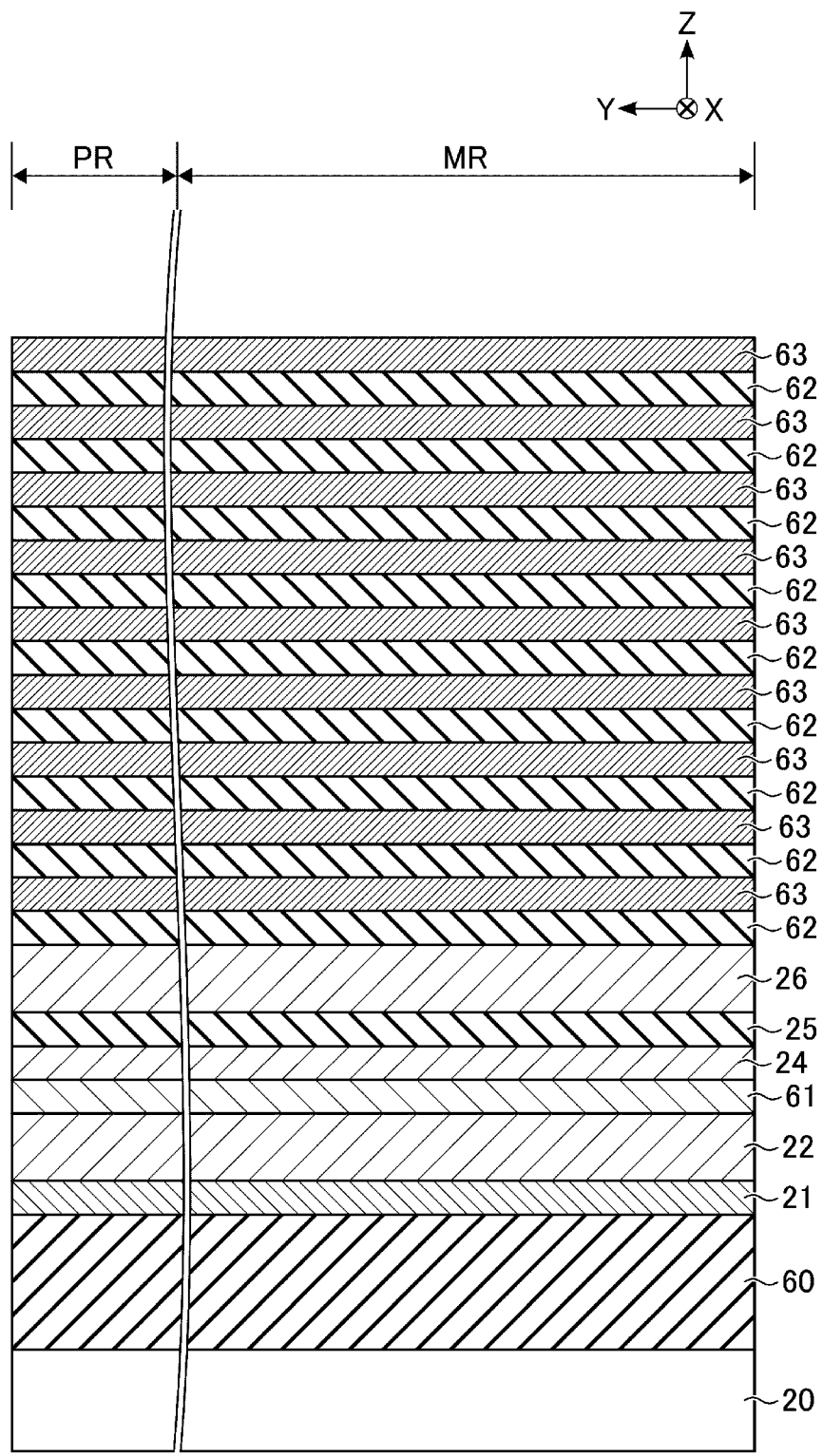

Next, as illustrated in FIG. 11, the conductor 26 is formed, and a plurality of replacement members 63 are stacked (Step S11).

Specifically, the conductor 26 is stacked on the insulating layer 25. The insulating layer 62 and the replacement member 63 are alternately stacked on the conductor 26. The number of layers in which the replacement member 63 is formed corresponds to the number of layers of the word line WL and the select gate line SGD to be stacked, for example. The insulating layer 62 contains silicon dioxide ($SiO_2$), for example. The replacement member 63 includes, for example, silicon nitride (SiN).

Figure 12:
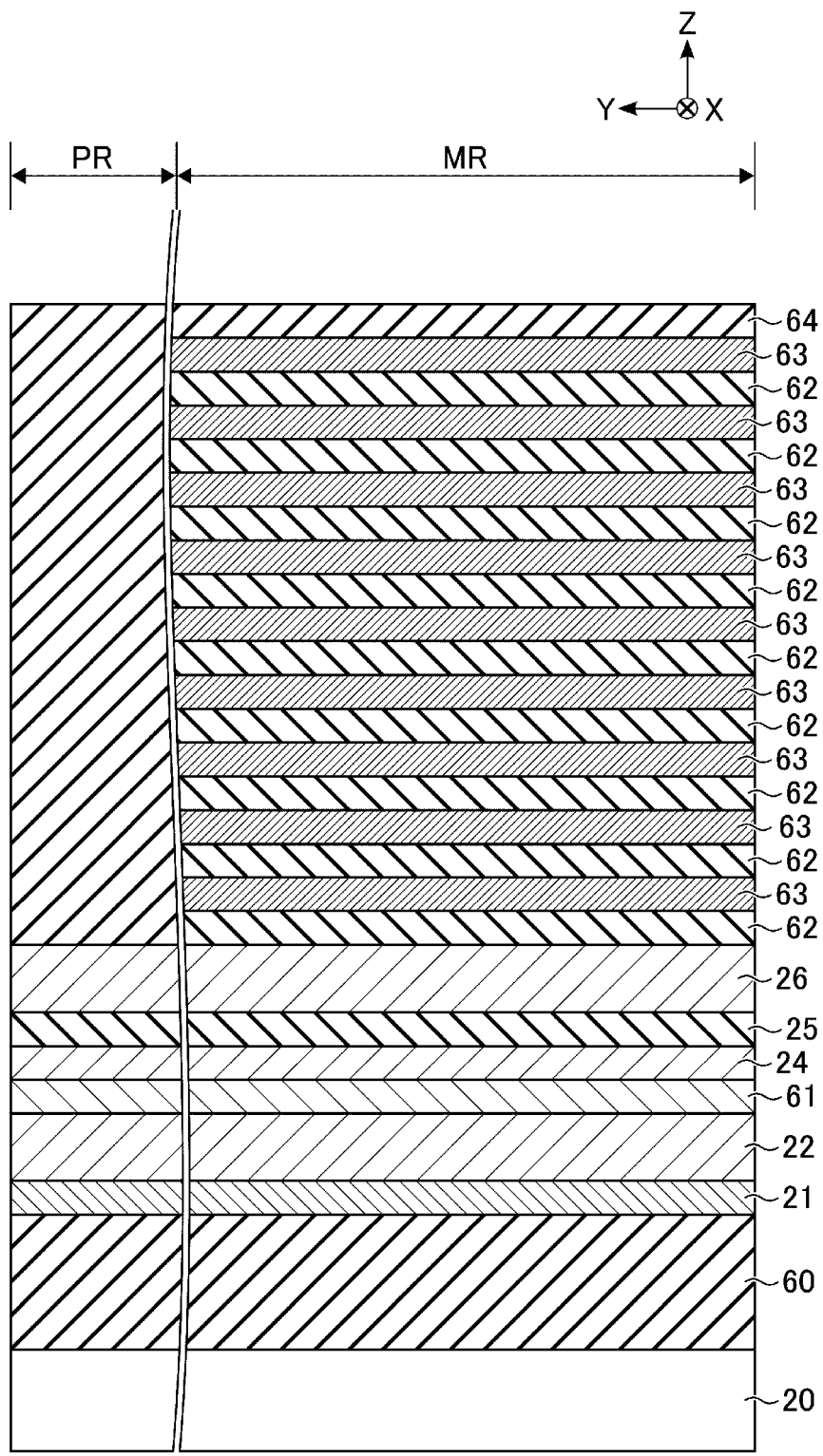

Next, the structure in the drawing region HR is processed, and the structure in the peripheral region PR is processed as illustrated in FIG. 12 (Step S12).

Specifically, in the region not illustrated, the stacked replacement member 63 is processed into a stepwise structure as described with reference to FIG. 8, for example. Then, for example, the insulating layer 62 and the replacement member 63 in the peripheral region PR are removed by main processing.

Thereafter, an insulating film 64 is formed on the structure formed on the semiconductor substrate 20, and the formed insulating film 64 is planarized by chemical mechanical polishing (CMP), for example.

Figure 13:
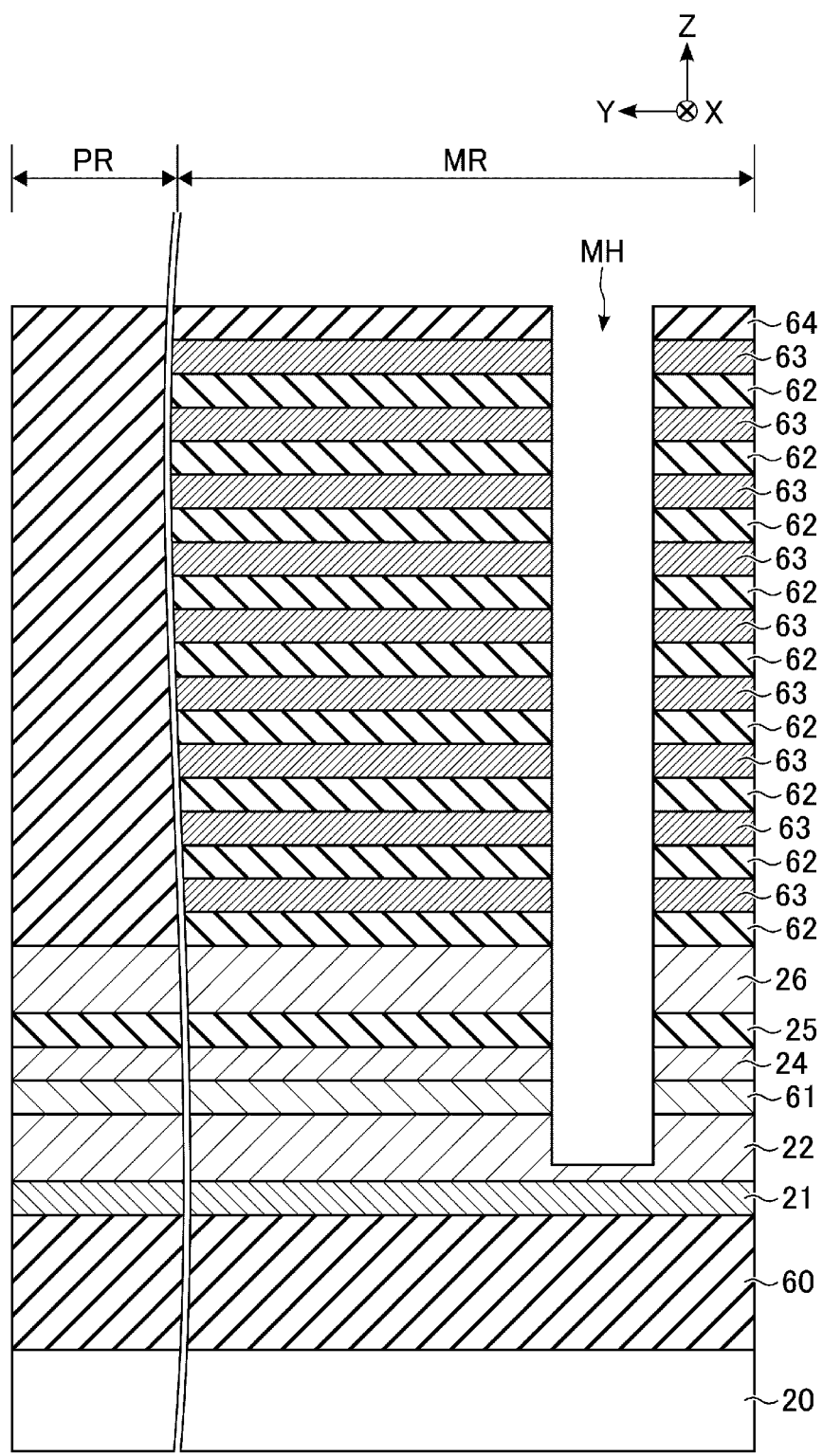

Next, as illustrated in FIG. 13, a memory hole MH is formed corresponding to a region where the memory pillar MP is to be formed (Step S13).

Specifically, first, a mask in which a region for forming the memory pillar MP is open is formed on the insulating film 64 by photolithography or the like. Then, by etching in which the formed mask is utilized, the memory hole MH is formed so as to reach the conductor 22 from the upper surface of the insulating film 64.

That is, in this step, the memory hole MH passes through the insulating film 64, the plurality of replacement members 63, the plurality of insulating layers 62, the conductor 26, the insulating layer 25, the conductor 24, and the sacrificial member 61. Then, the bottom of the memory hole MH stops in the layer in which the conductor 22 is formed, for example. As an etching method in this step, anisotropic etching such as a reactive ion etching (RIE) or the like is used.

In this process, the conductor 26 may be used as an etching stopper. By utilizing the conductor 26 as the etching stopper, the bottom of the memory hole MH is restrained from excessively entering into the inside of the conductor 22, and the bottoms of the plurality of memory holes MH can be more uniformly positioned.

Figure 14:
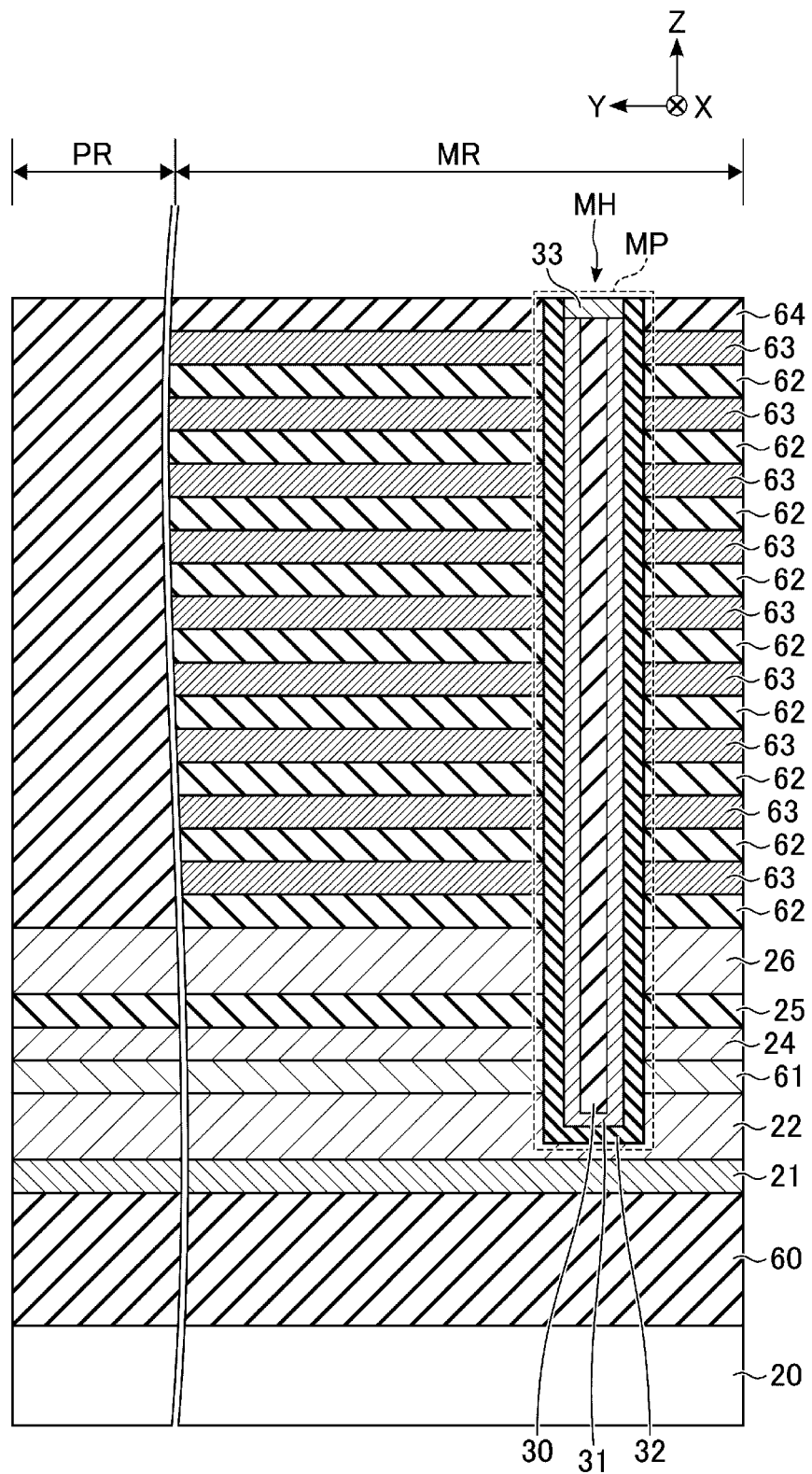

Next, as illustrated in FIG. 14, the memory pillar MP is formed inside the memory hole MH (Step S14).

Specifically, for example, the stacked film 32 (block insulating film 36, insulating film 35, and tunnel oxide film 34), the semiconductor 31, and the core member 30 are formed in this order on the upper surface of the insulating film 64 and the inner wall of the memory hole MH, respectively.

Thereafter, the stacked film 32, the semiconductor 31, and the core member 30 formed above the upper surface of the insulating film 64 are removed, and the core member 30 provided above the memory hole MH is removed. The "upper portion of the memory hole MH" corresponds to a portion included above the upper surface of the replacement member 63 provided on the uppermost layer. Then, the semiconductor 33 is formed in the region where the core member 30 is removed inside each of the memory holes MH.

Figure 15:
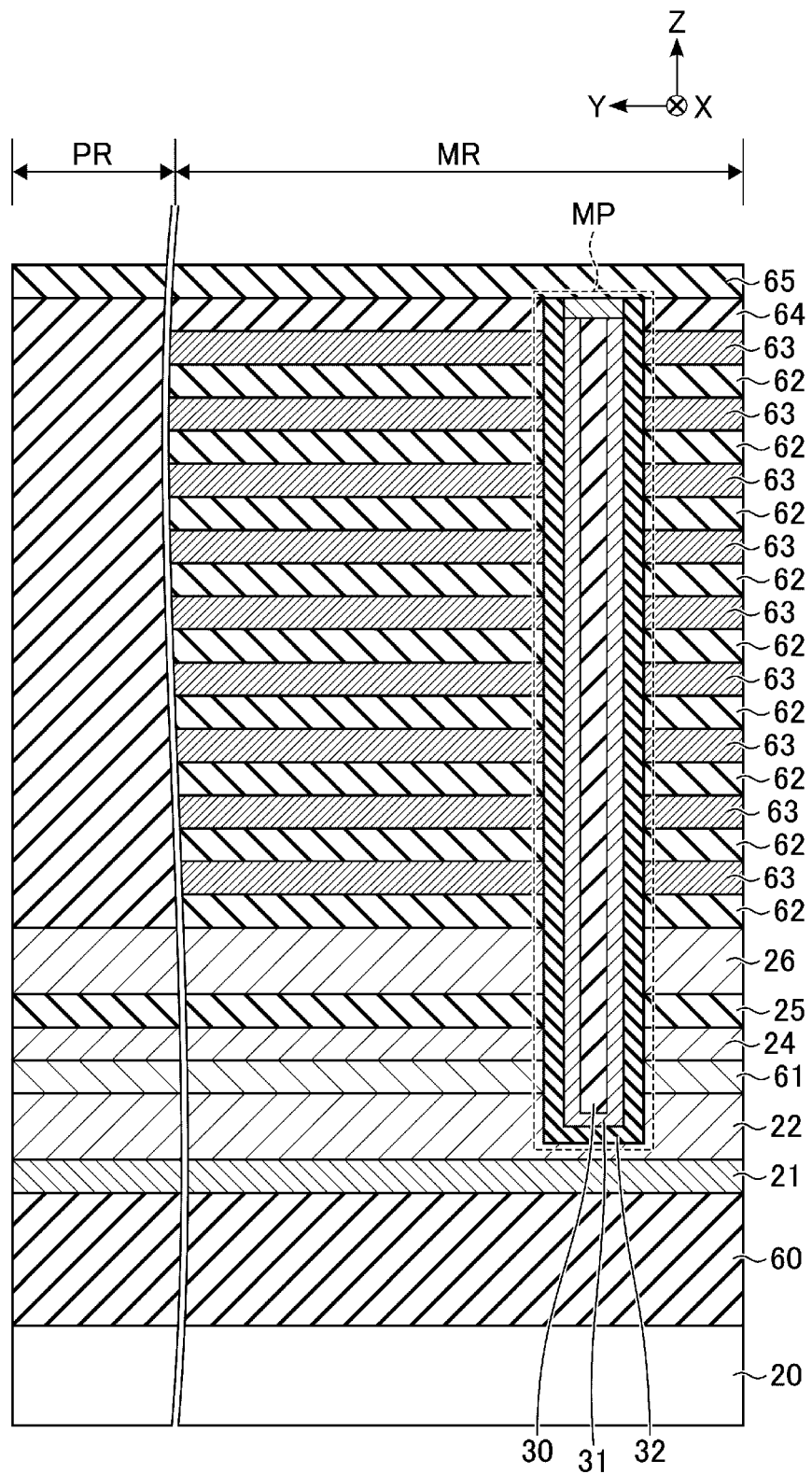

Next, as illustrated in FIG. 15, a protective film 65 is formed on the upper surface of the insulating film 64 and the upper surface of the memory pillar MP (Step S15). As the protective film 65, for example, silicon dioxide is formed.

Figure 16:
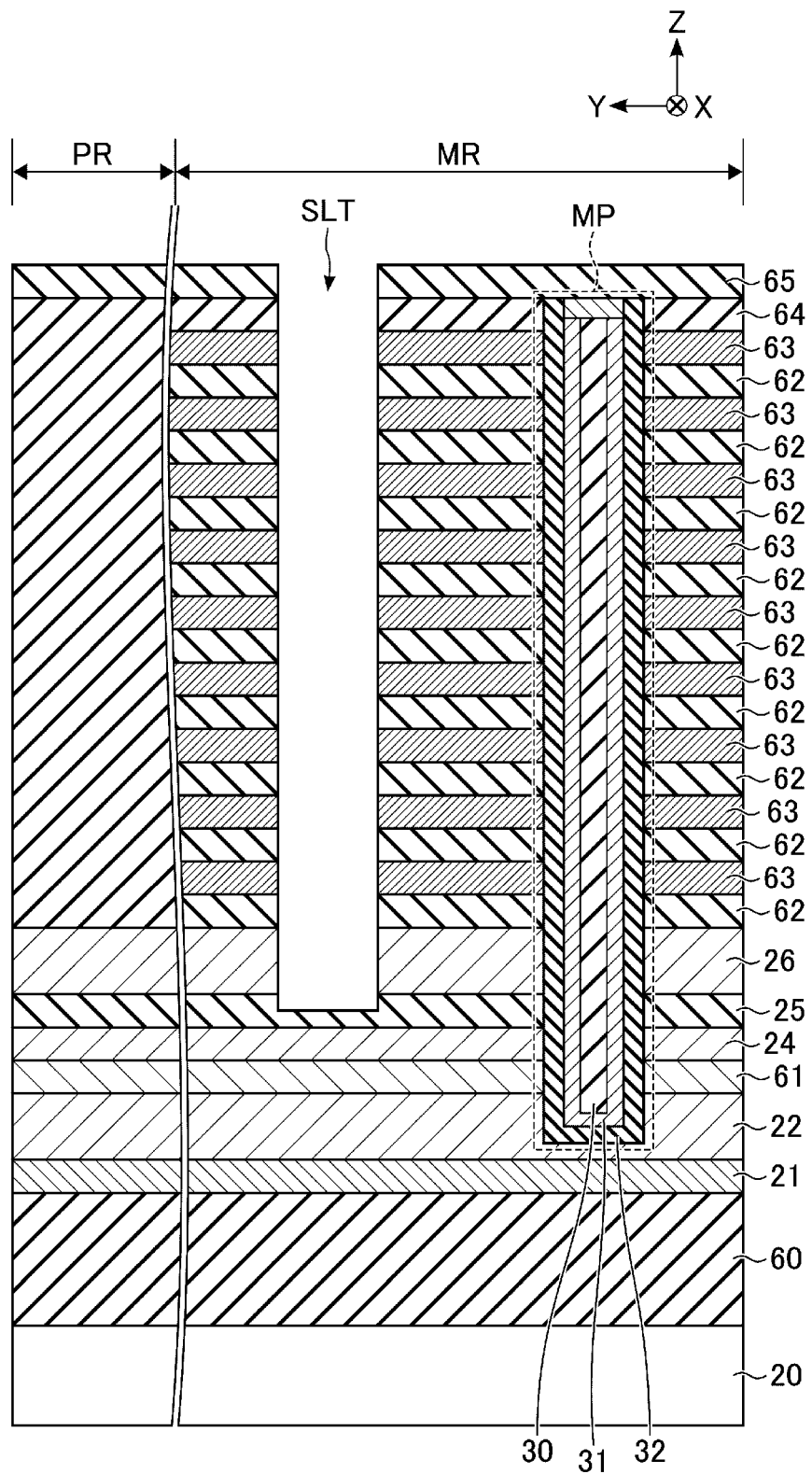

Next, as illustrated in FIG. 16, the slit SLT is formed (Step S16).

Specifically, first, a mask which has openings at regions for forming the slits SLT is formed on the protective film 65 by photolithography or the like. Then, by etching in which the formed mask is utilized, the slit SLT is formed so as to reach the insulating layer 25 from the upper surface of the protective film 65.

That is, in this step, the slit SLT penetrates the protective film 65, the insulating film 64, the plurality of replacement members 63, the plurality of insulating layers 62, and the conductor 26. Then, the bottom of the slit SLT stops in the layer in which the insulating layer 25 is formed, for example. As an etching method in this step, for example, anisotropic etching such as RIE is used.

In the etching of this step, although it is preferable that the bottom of the slit SLT stop within the layer in which the insulating layer 25 is formed, the bottom of the slit SLT may reach the layer where the conductor 24 is formed.

Figure 17:
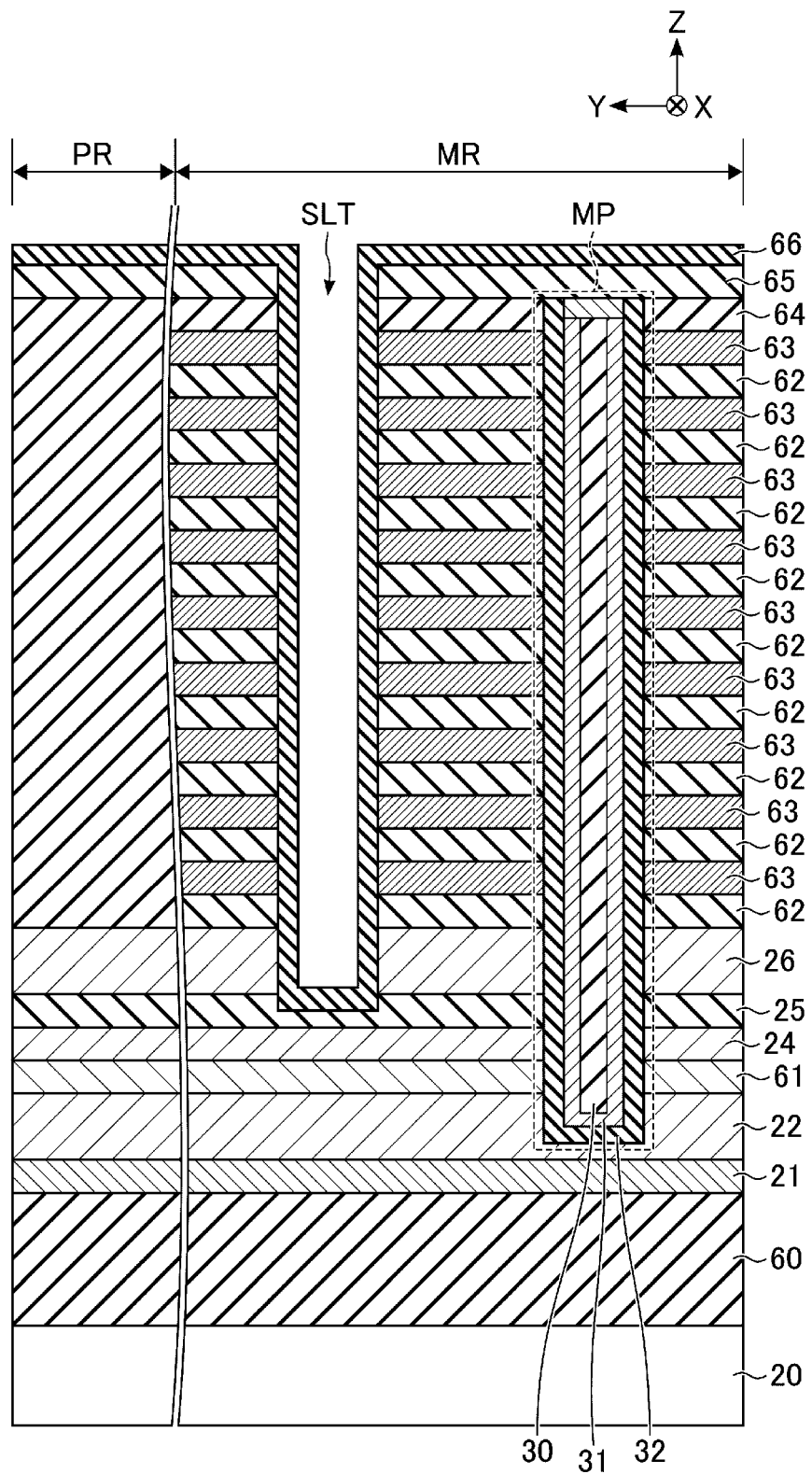

Next, as illustrated in FIG. 17, a spacer 66 is formed (Step S17).

Specifically, the spacer 66 is formed on the upper surface of the protective film 65 and on the inner walls of the slit SLT by chemical vapor deposition (CVD). As the spacer 66, for example, silicon nitride is formed.

Figure 18:
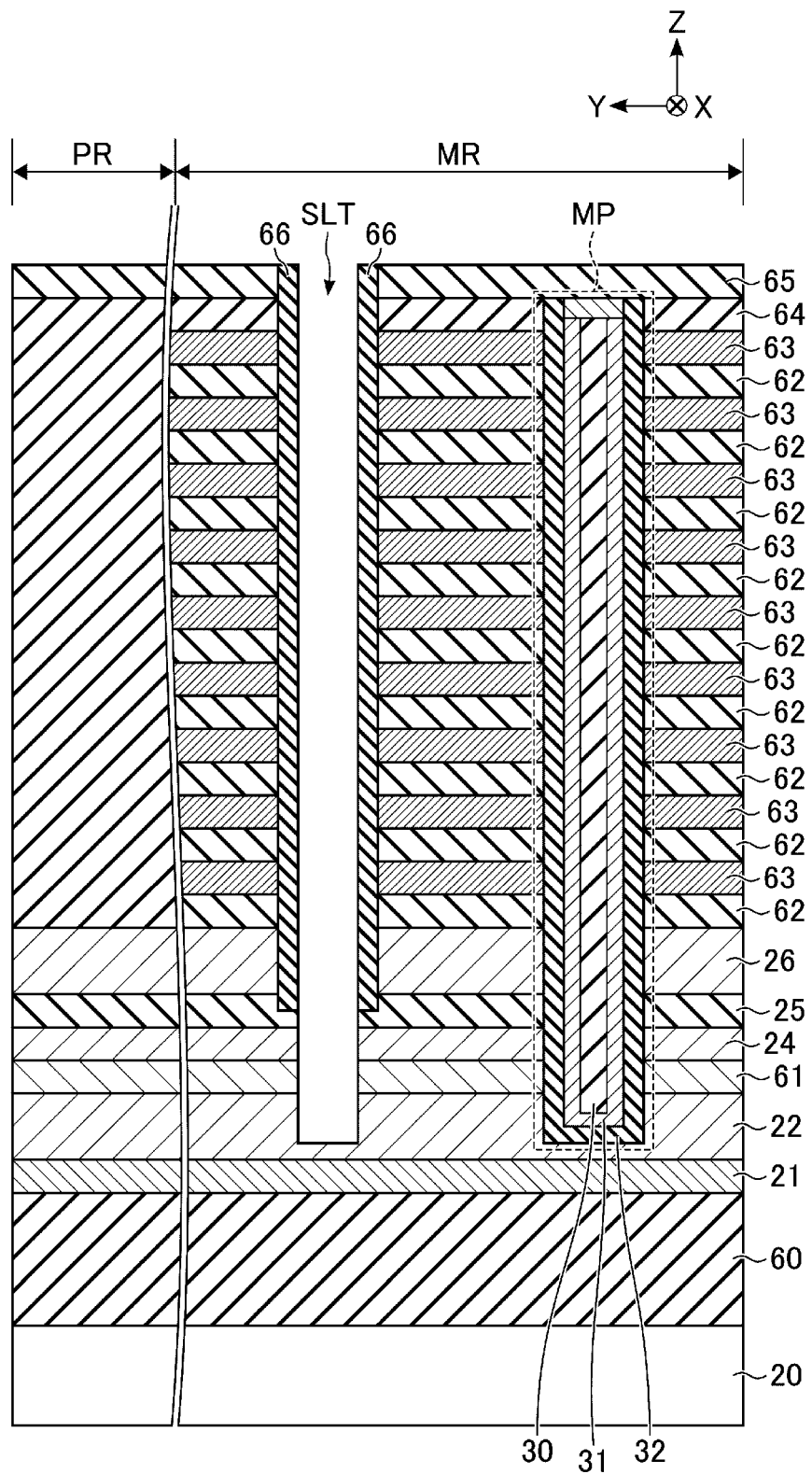

Next, as illustrated in FIG. 18, the spacer 66 is processed (Step S18).

Specifically, the spacer 66 formed on the upper surface of the protective film 65 and the spacer 66 formed at the bottom of the slit SLT are removed by, for example, RIE. With this, side walls of silicon nitride, for example, are formed on the side surfaces of the slit SLT.

Etching in this step is continued even after the spacer 66 formed at the bottom of the slit SLT is removed. As a result, the bottom of the slit SLT reaches, for example, the layer in which the sacrificial member 61 is formed by etching in this step.

In this process, the slit SLT may penetrate the sacrificial member 61, or the bottom of the slit SLT may reach the inside of the layer in which the conductor 22 is formed. In this process, the slit SLT may reach at least the sacrificial member 61.

Figure 19:
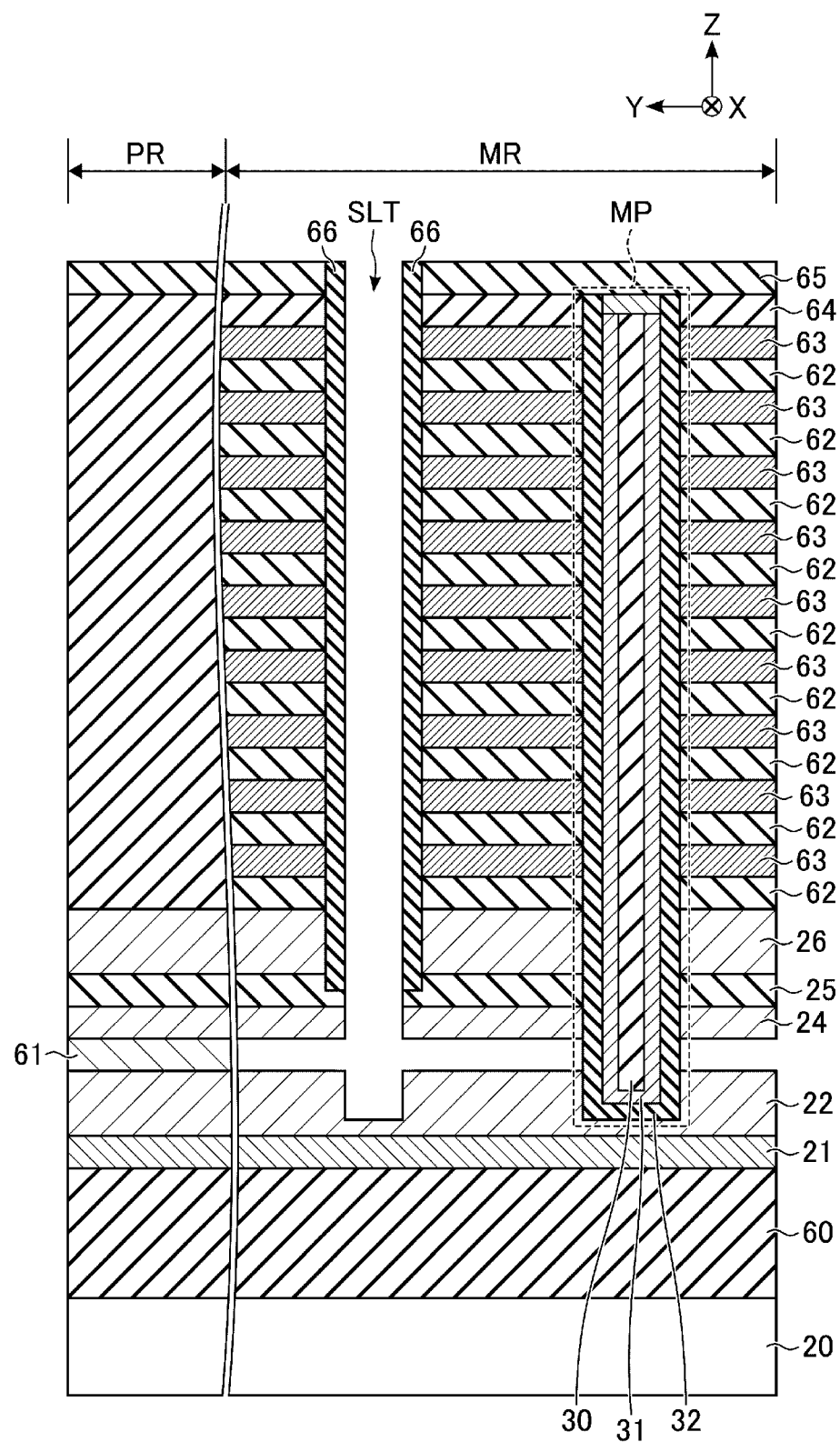

Next, as illustrated in FIG. 19, the sacrificial member 61 is removed (Step S19).

Specifically, when the sacrificial member 61 is formed of silicon germanium, the sacrificial member 61 is selectively etched through the slit SLT and the sacrificial member 61 is selectively removed by chemical dry etching (CDE) using, for example, chlorine trifluoride ($ClF_3$) gas. As a result, the side surfaces of the stacked film 32 are exposed at the lower portion of the memory pillar MP. The sacrificial member 61 may remain in the peripheral region PR without being removed.

Figure 20:
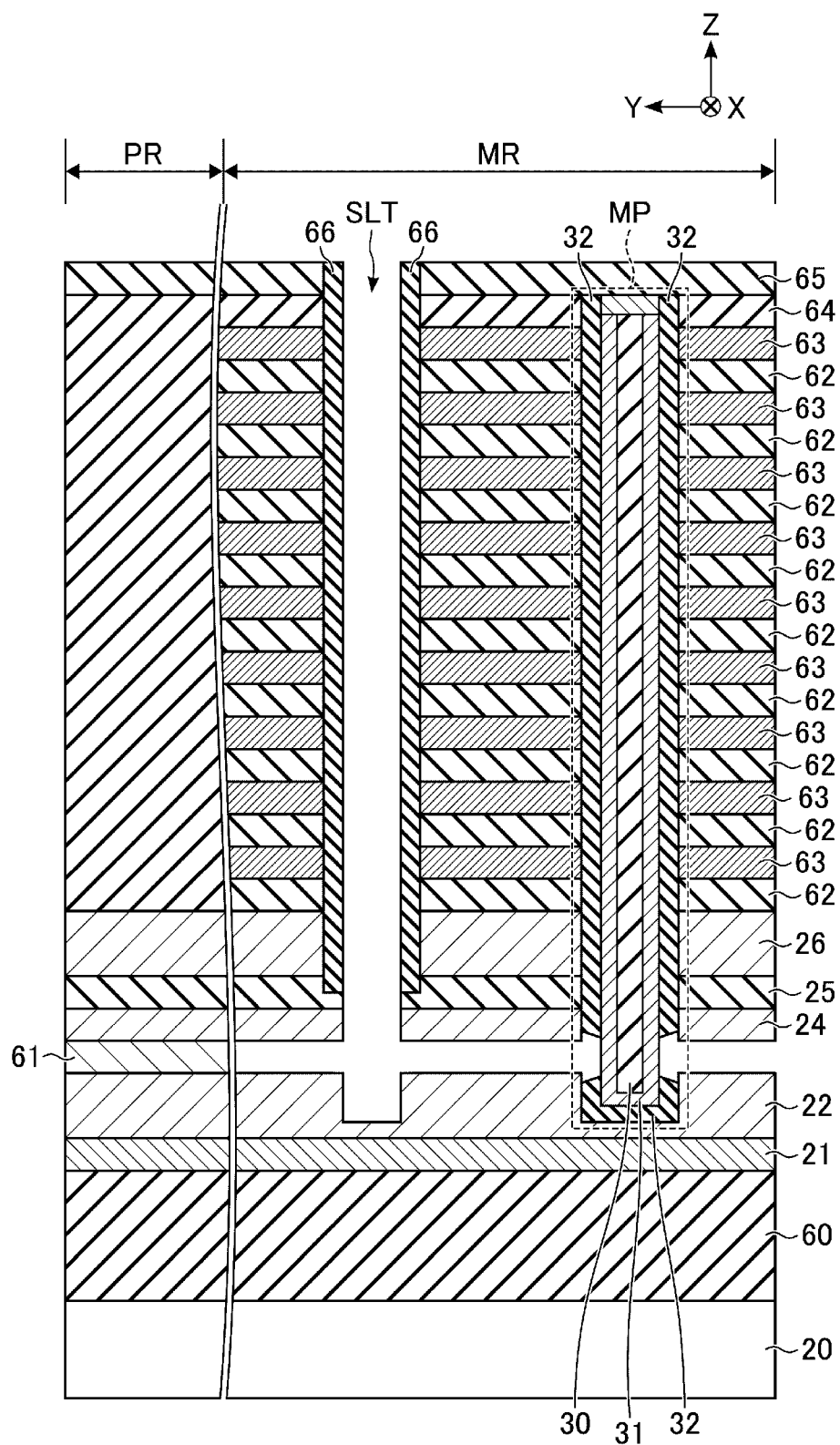

Next, as illustrated in FIG. 20, the stacked film 32 at the bottom of the memory pillar MP is removed (Step S20).

Specifically, the block insulating film 36, the insulating film 35, and the tunnel oxide film 34 are sequentially removed by wet etching or dry etching, for example. As a result, the side surfaces of the semiconductor 31 are exposed at the lower portion of the memory pillar MP.

Figure 21:
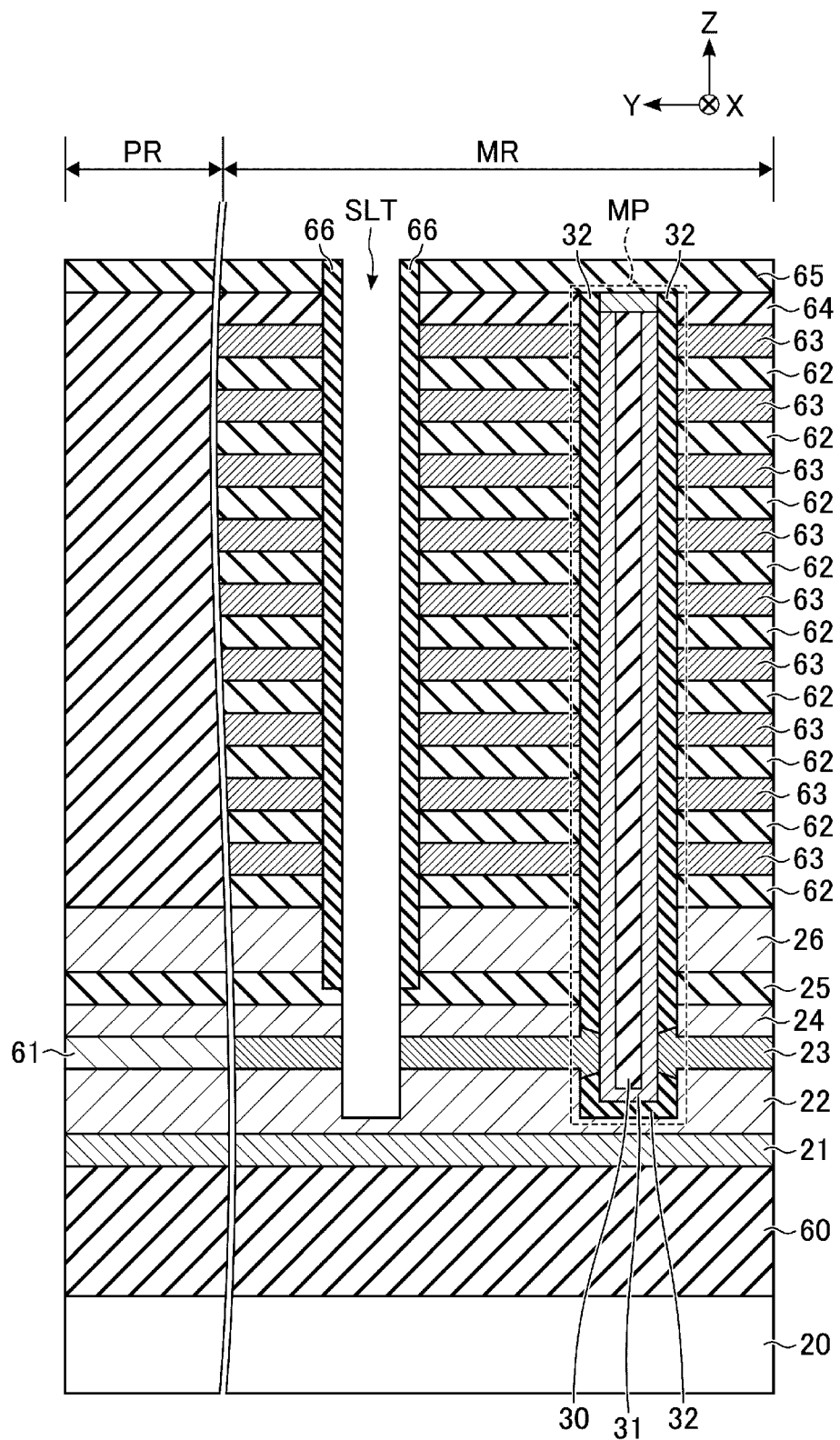

Next, as illustrated in FIG. 21, the conductor 23 is formed (Step S21).

Specifically, the conductor 23 is formed in a space created after the sacrificial member 61 is removed in Step S20, by CVD, for example, and then etched back. As a result, the semiconductor 31 of the memory pillar MP and the source line portion (set of the conductors 21 to 24) are electrically connected. As the conductor 23, for example, phosphorus doped polysilicon is formed.

As a method of etching back after the conductor 23 is formed, isotropic etching is used, for example. In this process, although the space from which the sacrificial member 61 has been removed is embedded with the conductor 23 (for example, phosphorus doped polysilicon), a groove of the slit SLT is required not to be embedded with, for example, the conductor 23. In this case, a width of the bottom of the slit SLT needs to be larger than a width of the sacrificial member 61 in the stack direction.

Figure 22:
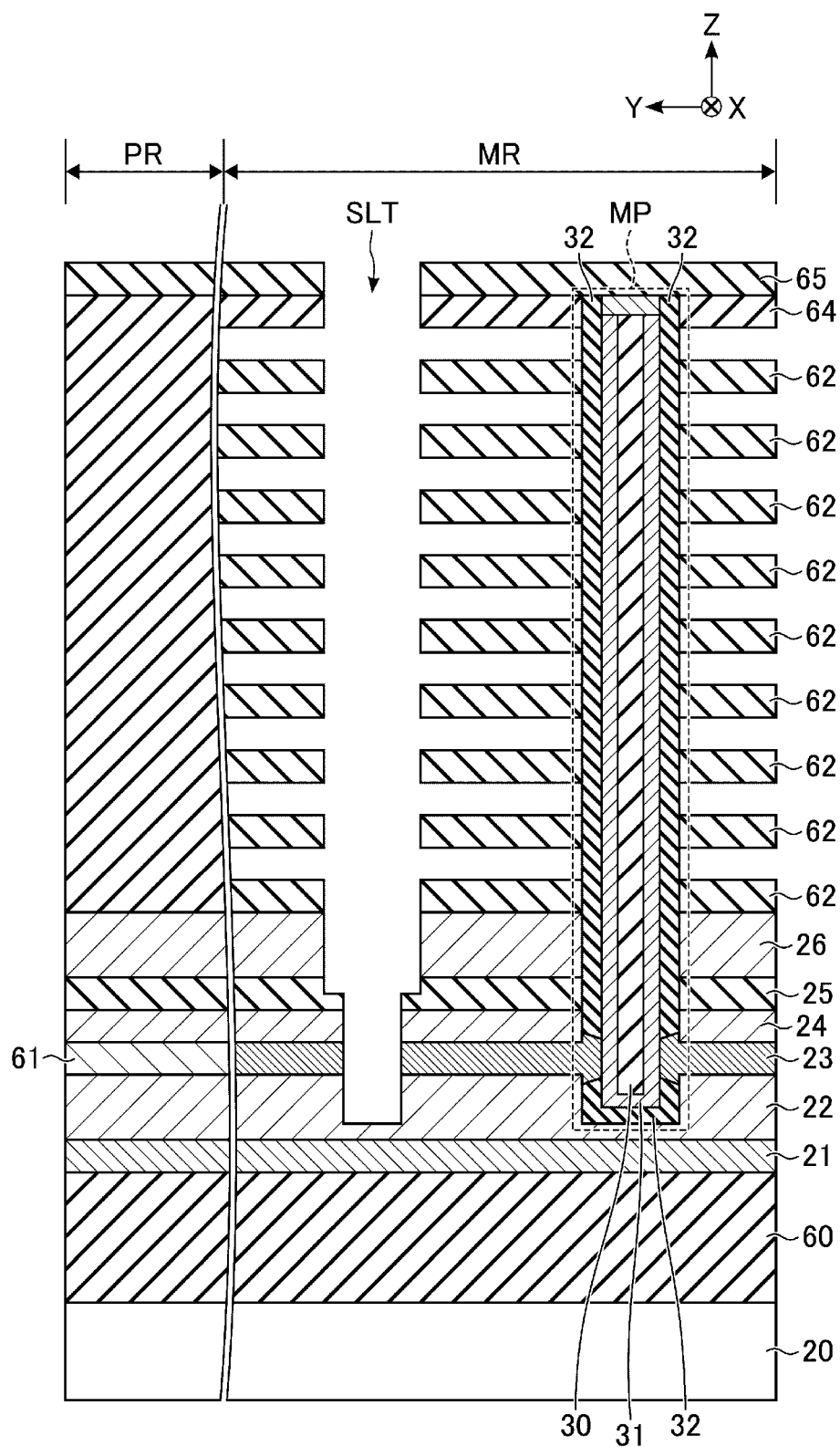

Next, as illustrated in FIG. 22, the spacer 66 and the replacement member 63 are removed (Step S22).

Specifically, first, surfaces of the conductors 22 to 24 (polysilicon film) exposed in the slit SLT are oxidized, and an oxidation protective film (not illustrated) is formed thereon. When the oxidation protective film is formed on the surfaces of the polysilicon films, it is necessary that an oxide protective film is not formed on the surface of the spacer 66. That is, it is necessary to selectively oxidize when forming the oxidation protective film in this step.

Thereafter, the spacer 66 and the replacement member 63 are removed by, for example, wet etching with a hot phosphoric acid. A three-dimensional structure of the structure from which the replacement member 63 is removed is maintained, for example, by the memory pillar MP.

Figure 23:
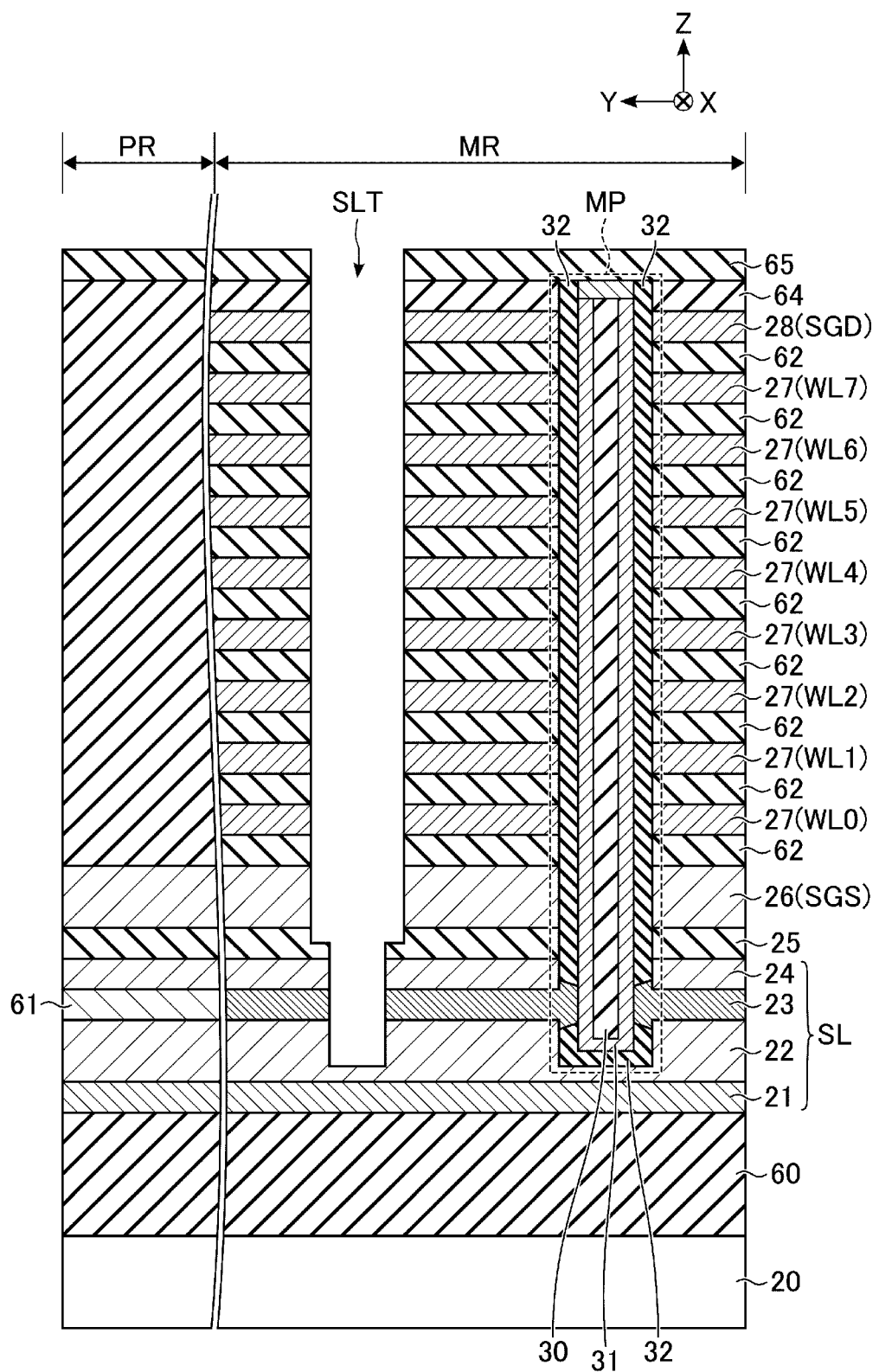

Next, as illustrated in FIG. 23, the conductors 27 and 28 are formed (Step S23).

Specifically, a conductor corresponding to the conductor 27 or 28 is formed in the space from which the replacement member 63 is removed in Step S22. For example, after a block film of aluminum oxide ($Al_2O_3$) or the like is formed, a metal film such as tungsten (W) is embedded.

Then, the conductor formed in the slit SLT is removed by wet etching, for example. Then, the plurality of conductors 27 and the conductors 28 provided in different layers are separated from each other. As a result, for example, the plurality of conductors 27 corresponding respectively to the word lines WL0 to WL7 and the conductor 28 corresponding to the select gate line SGD are formed, respectively.

Figure 24:
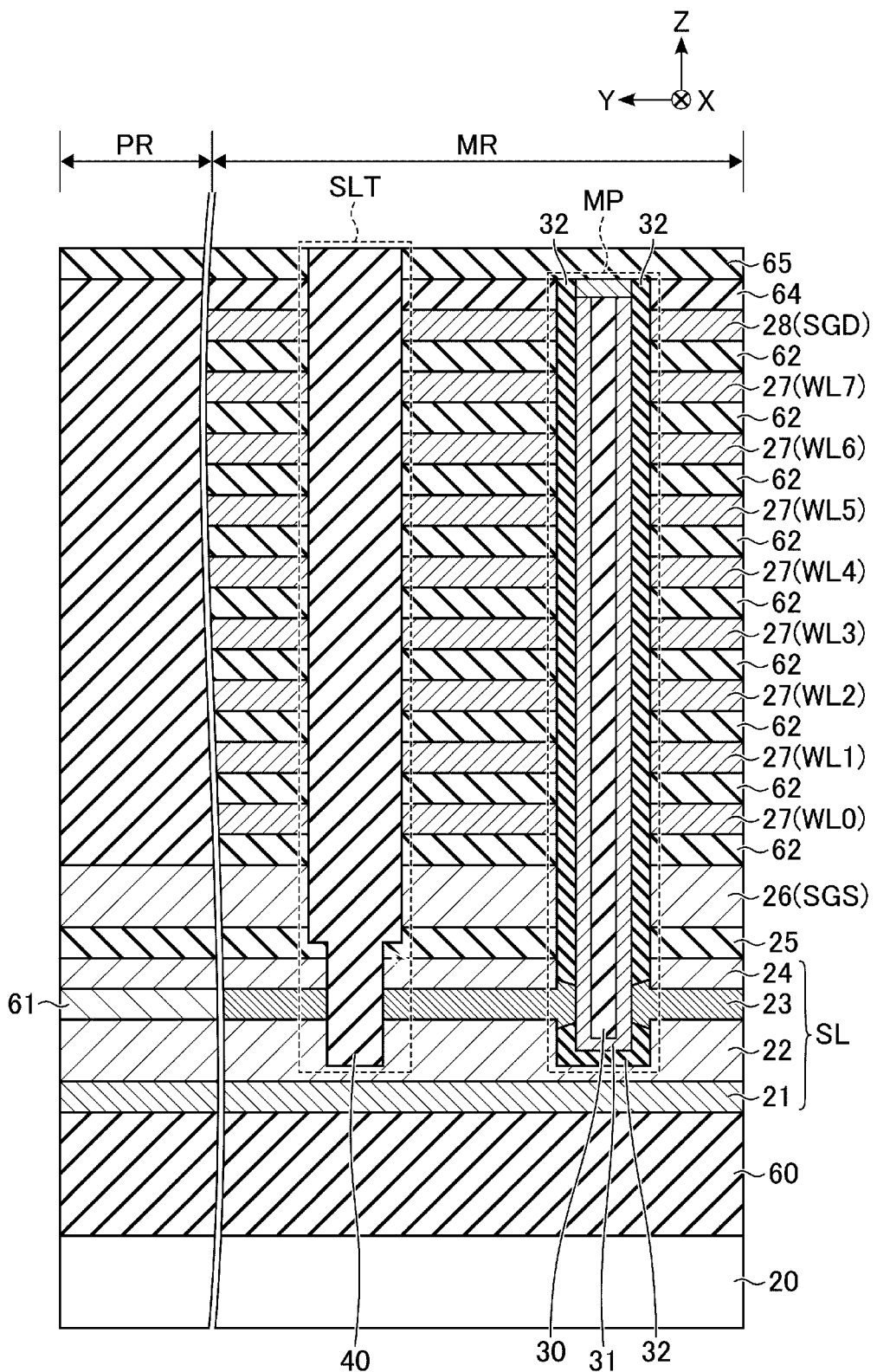

Next, as illustrated in FIG. 24, the insulator 40 is formed in the slit SLT (Step S24). In this process, silicon nitride or the like may be formed as the side wall of the slit SLT before the insulator 40 is embedded in the slit SLT.

According to the manufacturing process described above, the NAND string NS, the source line SL connected to the NAND string NS, the select gate lines SGS and SGD, and the word line WL are formed, respectively. The manufacturing process described above is merely an example, and other processing may be inserted between each manufacturing process.

[1-3] Other Configuration of Source Line Portion

In the configuration and the manufacturing method of the memory cell array 10 described above, a stacked structure of the source line portion may have other configurations. For example, a combination of the material used as the conductors 22 and 24 and the material used as the sacrificial member 61 may be other combinations. Hereinafter, a first to seventh combinations of the conductors 22 and 24 and the sacrificial member 61 will be sequentially described.

First Combination

In the first combination, carbon (C) doped polysilicon (Si) is used as each of the conductors 22 and 24, and silicon germanium (SiGe) is used as the sacrificial member 61.

When the first combination is applied to the first embodiment, wet etching using an aqueous solution containing, for example, hydrogen fluoride (HF) and nitric acid ($HNO_3$) is executed in Step S19 of the manufacturing process of the semiconductor memory 1.

Second Combination

In the second combination, nitrogen (N) doped polysilicon is used as each of the conductors 22 and 24, and silicon germanium is used as the sacrificial member 61.

When the second combination is applied to the first embodiment, wet etching using an aqueous solution containing, for example, hydrogen fluoride and nitric acid is executed in Step S19 of the manufacturing process of the semiconductor memory 1.

Third Combination

In the third combination, oxygen (O) doped polysilicon is used as each of the conductors 22 and 24, and silicon germanium is used as the sacrificial member 61.

When the third combination is applied to the first embodiment, wet etching using an aqueous solution containing, for example, hydrogen fluoride and nitric acid is executed in Step S19 of the manufacturing process of the semiconductor memory 1.

Fourth Combination

In the fourth combination, boron (B) doped polysilicon is used as each of the conductors 22 and 24, and silicon germanium is used as the sacrificial member 61.

When the fourth combination is applied to the first embodiment, wet etching using an aqueous solution containing, for example, hydrogen fluoride and nitric acid is executed in Step S19 of the manufacturing process of the semiconductor memory 1.

Fifth Combination

In the fifth combination, carbon doped polysilicon is used as each of the conductors 22 and 24, and non-doped polysilicon is used as the sacrificial member 61.

When the fifth combination is applied to the first embodiment, wet etching using an aqueous solution containing, for example, potassium hydroxide (KOH) is executed in Step S19 of the manufacturing process of the semiconductor memory 1.

Sixth Combination

In the sixth combination, nitrogen doped polysilicon is used as each of the conductors 22 and 24, and non-doped polysilicon is used as the sacrificial member 61.

When the sixth combination is applied to the first embodiment, wet etching using an aqueous solution containing, for example, choline is executed in Step S19 of the manufacturing process of the semiconductor memory 1.

Seventh Combination

In the seventh combination, oxygen doped polysilicon is used as each of the conductors 22 and 24, and non-doped polysilicon is used as the sacrificial member 61.

When the seventh combination is applied to the first embodiment, wet etching using an aqueous solution containing, for example, choline is executed in Step S19 of the manufacturing process of the semiconductor memory 1.

Eighth Combination

In the eighth combination, boron doped polysilicon is used as each of the conductors 22 and 24, and non-doped polysilicon is used as the sacrificial member 61.

When the eighth combination is applied to the first embodiment, wet etching using an aqueous solution containing, for example, tetramethylammonium hydroxide (TMAH) is executed in Step S19 of the manufacturing process of the semiconductor memory 1.

In each of the first to fourth combinations described above, silicon germanium is used as the sacrificial member 61. In the wet etching in Step S19, for example, an HF/HNO$_3$ aqueous solution having a high etching rate of silicon germanium is used. As a result, in the etching of Step S19, the etching selection ratio between the conductors 22 and 24 and the sacrificial member 61 is increased, and the sacrificial member 61 can be selectively removed.

In each of the fifth to eighth combinations, non-doped polysilicon is used as the sacrificial member 61. Then, by using some impurities doped polysilicon as the conductors 22 and 24, the etching rate of the conductors 22 and 24 in the wet etching using an organic alkaline aqueous solution in Step S19 becomes low. As a result, in the etching of Step S19, the etching selection ratio between the conductors 22 and 24 and the sacrificial member 61 is increased, and the sacrificial member 61 can be selectively removed.

In the fourth and eighth combinations, it is desirable to compensate for boron of the conductors 22 and 24 formed in the region where the sacrificial member 61 is formed with the conductor 23 (for example, polysilicon doped with phosphorus), and operate the conductors 22 and 24 as an n-type semiconductor films as a whole. In other words, in the semiconductor layer of the source line portion formed by the conductors 22 to 24, it is desirable to make electron density higher than hole density. The reason for this is that the NAND string NS is desirably operated as an n-type NAND string NS, and it is necessary to make the conductors 22 and 24 used for the source line portion into n-type.

In the fourth and eighth combinations, in order to make the conductors 22 and 24 into an n-type semiconductor film, for example, phosphorus in the conductor 23 is diffused into the conductors 22 and 24 by heat treatment after the conductor 23 is formed. Then, each of the conductors 22 and 24 contains phosphorus and boron, and a doping amount of phosphorus exceeds a doping amount of boron.

As a result, in the semiconductor layer of the source line portion, the electron density exceeds the hole density, and each of the conductors 22 and 24 can be operated as the n-type.

In the description as above, although the case where the conductors 22 and 24 are made of the same material is described by way of an example, the conductor 22 and the conductor 24 may have different compositions. For example, concentrations of impurities doped in the conductor 22 and the conductor 24 may be different from each other, or the impurities doped in the conductor 22 and the impurities doped in the conductor 24 may be different from each other.

In the configuration and the method for manufacturing the semiconductor memory 1 according to the first embodiment described above, polysilicon may be in an amorphous state at the time of film formation. For example, in the manufacturing process of the semiconductor memory 1, the conductor 23 formed in Step S21 may be in the amorphous state by reducing heat treatment in the middle. A silicon film formed in the amorphous state is crystallized by, for example, subsequent heat treatment.

[1-4] Effects of First Embodiment

According to the semiconductor memory 1 according to the first embodiment described above, a yield of the semiconductor memory 1 can be improved. Details of this effect will be described below.

In a manufacturing process of a semiconductor memory device in which memory cells are three-dimensionally stacked, a memory hole is formed after a stacked body in which replacement members and insulating layers are alternately stacked is formed. In the memory hole, a multilayer film including, for example, an oxide-nitride-oxide (ONO) film and a channel semiconductor is formed, and a memory pillar functioning as a NAND string is formed. In each memory pillar, for example, the ONO film at the bottom is removed and the channel semiconductor in the memory pillar is electrically connected to the source line through the bottom surface of the memory pillar.

Thereafter, a slit is formed in the structure on which the memory cell array is formed, and processing of replacing the replacement member with a semiconductor is executed. As a result, a stacked wiring structure in which wiring connected to the NAND string NS is stacked is formed. As a method of increasing storage capacity per unit area in such a semiconductor memory device, it is conceivable to increase the number of stacked word lines and increase the number of memory cells in one NAND string.

However, when the number of stacked word lines is increased, an aspect ratio of the memory hole is increased, and difficulty of removing the ONO film formed at the bottom of the memory hole is increased by RIE or the like. That is, as the aspect ratio of the memory hole becomes higher, it may become more difficult to secure contact of the source line from the bottom surface of the memory pillar.

In contrast, in the semiconductor memory 1 according to the first embodiment, the channel semiconductor (semiconductor 31) in the memory pillar MP and the source line SL (for example, conductor 23) are electrically connected through the lower side surface of the memory pillar MP.

Specifically, in the manufacturing process of the semiconductor memory 1 according to the first embodiment, first, a conductor 22, a sacrificial member 61, and a conductor 24 are stacked in this order, as the source line portion. After the slit SLT is formed and before replacement processing of the word line WL and the like is executed, the sacrificial member 61 is removed via the slit SLT. Thereafter, the ONO film (stacked film 32) on the lower side surface of the memory pillar is removed through the space from which the sacrificial member 61 is removed, and the conductor 23 is formed in the space.

As a result, in the semiconductor memory 1 according to the first embodiment, the semiconductor 31 in the memory pillar MP and the conductor 23 in the source line portion are in contact with the lower side surface of the memory pillar MP. That is, the channel semiconductor of the memory pillar MP and the source line SL are electrically connected through the lower side surface of the memory pillar MP.

In the method for manufacturing the semiconductor memory 1 according to the first embodiment, contacts with the source line SL on the lower side surface of the memory pillar MP are formed so as to make it possible to omit RIE for the bottom of the memory hole MH having a high aspect ratio.

With this configuration, in the method for manufacturing the semiconductor memory 1 according to the first embodiment, it is possible to reduce process difficulty at the time of forming the contact of the source line SL and to alleviate restriction at the time of processing the memory hole MH. Accordingly, in the method for manufacturing the semiconductor memory 1 according to the first embodiment, it is possible to improve the yield of the semiconductor memory 1.

In the semiconductor memory 1 according to the first embodiment, the following effects can be further obtained. Other effects of the semiconductor memory 1 according to the first embodiment will be listed below.

In the method for manufacturing the semiconductor memory 1 according to the first embodiment, the area of the contact between the semiconductor 31 in the memory pillar MP and the source line portion can be more uniform, so that variation in characteristics of the NAND string NS can be reduced.

In the method for manufacturing the semiconductor memory 1 according to the first embodiment, a material capable of achieving a high etching selection ratio between the sacrificial member 61 and the conductors 22 and 24 sandwiching the sacrificial member 61 is selected. The conductors 22 and 24 and the sacrificial member 61 basically have a stacked structure of semiconductor films made of homologous elements. An example of the stacked structure of the source line portion is Si/SiGe/Si (conductor 22/sacrificial member 61/conductor 24).

In this case, in the method for manufacturing the semiconductor memory 1 according to the first embodiment, complicated step switching is unnecessary in RIE for forming the memory hole MH. That is, in the method for manufacturing the semiconductor memory 1 according to the first embodiment, processing of the memory hole MH is facilitated and controllability of a hole diameter of the memory hole MH is improved. Accordingly, in the method for manufacturing the semiconductor memory 1 according to the first embodiment, the yield and the variation in characteristics can be favorably changed.

In the manufacturing process of the semiconductor memory 1 according to the first embodiment, in the process of removing the sacrificial member 61, the conductor 26 is protected by the spacer 66 being formed between the opening of the slit SLT and the conductor 26. On the other hand, the conductors 22 and 24 have a high etching selection ratio with respect to the sacrificial member 61, so that it is possible to prevent the conductors 22 and 24 from being processed into an unintended shape by etching in this step.

For that reason, in the semiconductor memory 1 according to the first embodiment, the side surfaces of the conductors 22 and 24 need not be protected when removing the sacrificial member 61, and a range in which the spacers 66 are formed can be narrowed.

As a result, in the semiconductor memory 1 according to the first embodiment, it is possible to prevent defective embedding of the conductor 23, which can occur when the range where the spacer 66 is formed reaches the layer in which the sacrificial member 61 is formed. Accordingly, in the method for manufacturing the semiconductor memory 1 according to the first embodiment, it is possible to stably form the conductor 23, and the yield can be increased.

In the method for manufacturing the semiconductor memory 1 according to the first embodiment, the conductor 23 (for example, phosphorus doped polysilicon) is embedded in the space from which the sacrificial member 61 is removed. This conductor 23 is also formed on the side walls and the bottom of the slit SLT. Then, the conductor 23 formed on the side walls and bottom of the slit SLT is removed by etching back.

A film thickness of the conductor 23 formed in the slit SLT varies based on a layer thickness of the sacrificial member 61. For that reason, in the semiconductor memory 1 according to the first embodiment, it is possible to reduce the film thickness of the conductor 23 in the slit SLT by preventing the layer thickness of the sacrificial member 61.

When the layer thickness of the sacrificial member 61 is designed as thin as possible, an etching back amount after forming the conductor 23 can be reduced. As a result, in the semiconductor memory 1 according to the first embodiment, the width of the slit SLT can be reduced. Accordingly, in the semiconductor memory 1 according to the first embodiment, it is possible to reduce the area of the memory cell array 10 and reduce the manufacturing cost.

In the structure of the semiconductor memory 1 according to the first embodiment, there may be a region (for example, peripheral region PR) where the sacrificial member 61 remains. In the peripheral region PR, a through-contact for connecting a wiring (for example, conductor 53) drawn out from the word line WL or the like, for example, to a circuit on the semiconductor substrate 20 is formed. Such a through contact is insulated from the source line portion by, for example, a spacer insulating film formed on the side walls of the through contact.

Also in such a case, since the sacrificial member 61 in the semiconductor memory 1 according to the first embodiment is in a state of being electrically connected to each of the conductors 22 and 24, unintended charge accumulation or the like is prevented.

As a result, in the semiconductor memory 1 according to the first embodiment, it is possible to prevent short-circuit defects that are induced to occur in a region in which the sacrificial member 61 remains and the through-contact penetrates the source line portion. Accordingly, in the semiconductor memory 1 according to the first embodiment, it is easy to identify defects relating to the source line portion, and the yield can be increased.

When any one of the fifth to eighth combinations is applied to the semiconductor memory 1 according to the first embodiment, the only differences between the conductors 22 and 24 and the sacrificial member 61 are the kind and amount of impurities to be doped.

For that reason, the manufacturing cost of the semiconductor memory 1 when any one of the fifth to eighth combinations is applied may be lower than the manufacturing cost of the semiconductor memory 1 to which any one of the first to fourth combinations in which SiGe is used is applied.

[2] Second Embodiment

A semiconductor memory 1 according to a second embodiment is different from that according to the first embodiment in the stacked structure of the source line portion. Hereinafter, points of the semiconductor memory 1 according to the second embodiment that are different from the first embodiment will be described.

[2-1] Structure of Memory Cell Array 10

Figure 25:
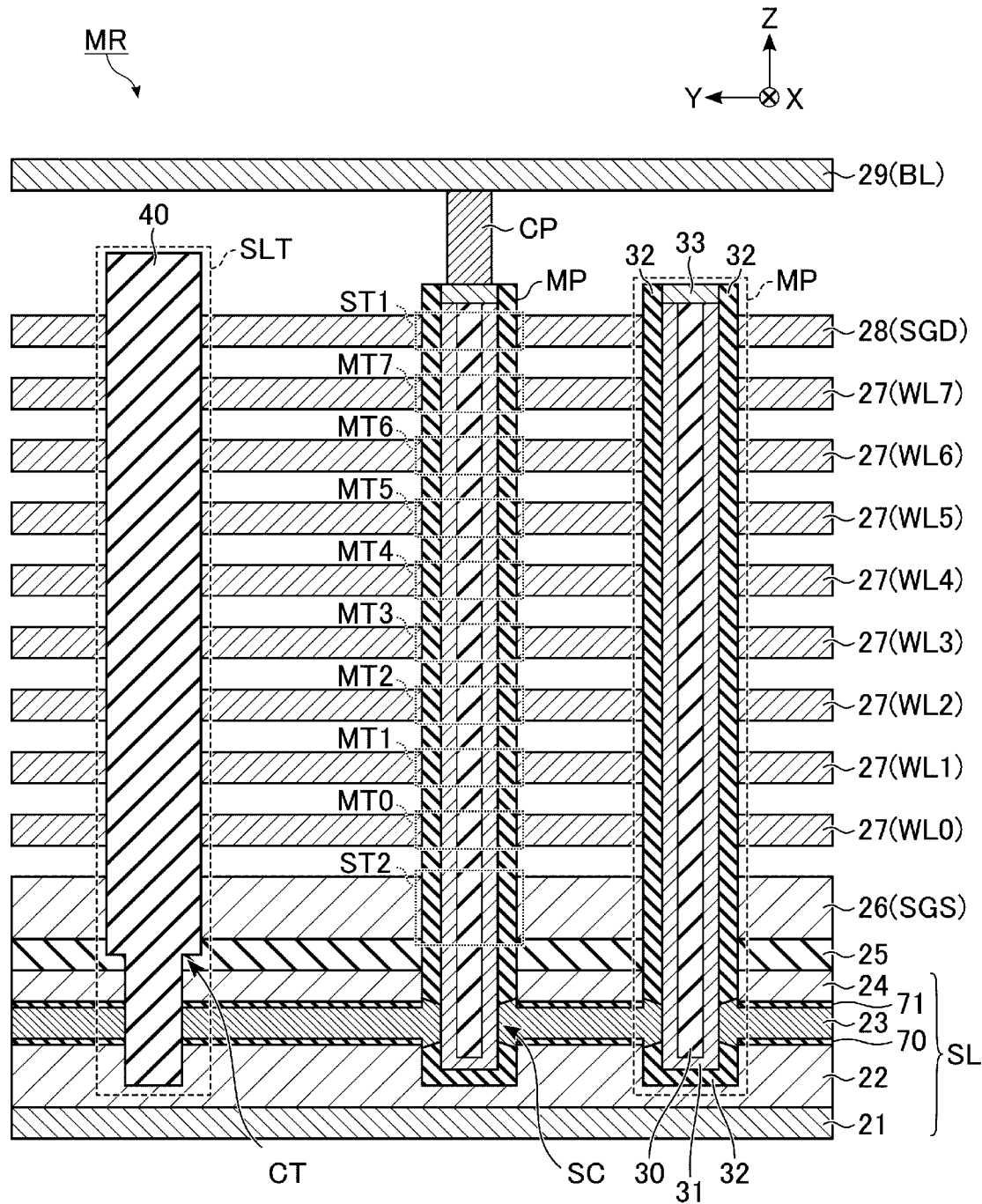
FIG. 25 illustrates a cross-sectional view of an example of a cross-sectional structure in a memory region of a memory cell array in a semiconductor memory according to a second embodiment.

FIG. 25 illustrates an example of a cross-sectional structure in the memory region MR of the memory cell array 10 in the second embodiment by extracting a region similar to FIG. 5 described in the first embodiment.

As illustrated in FIG. 25, the memory cell array 10 in the second embodiment has a structure in which a thin film 70 is provided between the conductors 22 and 23 and a thin film 71 is provided between the conductors 23 and 24, in the memory cell array 10 in the first embodiment described with reference FIG. 5.

The thin films 70 and 71 are insulators such as silicon dioxide ($SiO_2$) and silicon nitride (SiN), for example. The thickness of the thin film 70 is designed so as not to electrically insulate the conductors 22 and 23. The thickness of the thin film 71 is designed so as not to electrically insulate the conductors 23 and 24. The thickness of each of the thin films 70 and 71 is desirably 2 nm or less, for example.

The same material or different materials may be used for the thin films 70 and 71. Each of the thin films 70 and 71 may contain impurities contained in the semiconductor layer which is in contact therewith. In addition, the film thickness of the thin film 70 and the film thickness of the thin film 71 may be the same or different.

The other structure of the semiconductor memory 1 according to the second embodiment is the same as that of the first embodiment and thus description thereof will be omitted.

[2-2] Manufacturing Method of Semiconductor Memory 1

The method for manufacturing the semiconductor memory 1 according to the second embodiment is, for example, the same as the flowchart described with reference to FIG. 9 in the first embodiment. Each of FIGS. 26 to 32 illustrates an example of a cross-sectional structure of a structure formed in the memory region MR in the manufacturing process of the semiconductor memory 1 according to the second embodiment.

Hereinafter, regarding the method for manufacturing the semiconductor memory 1 according to the second embodiment, points different from those of the first embodiment will be described with reference to FIG. 9 and FIGS. 26 to 32.

Figure 26:
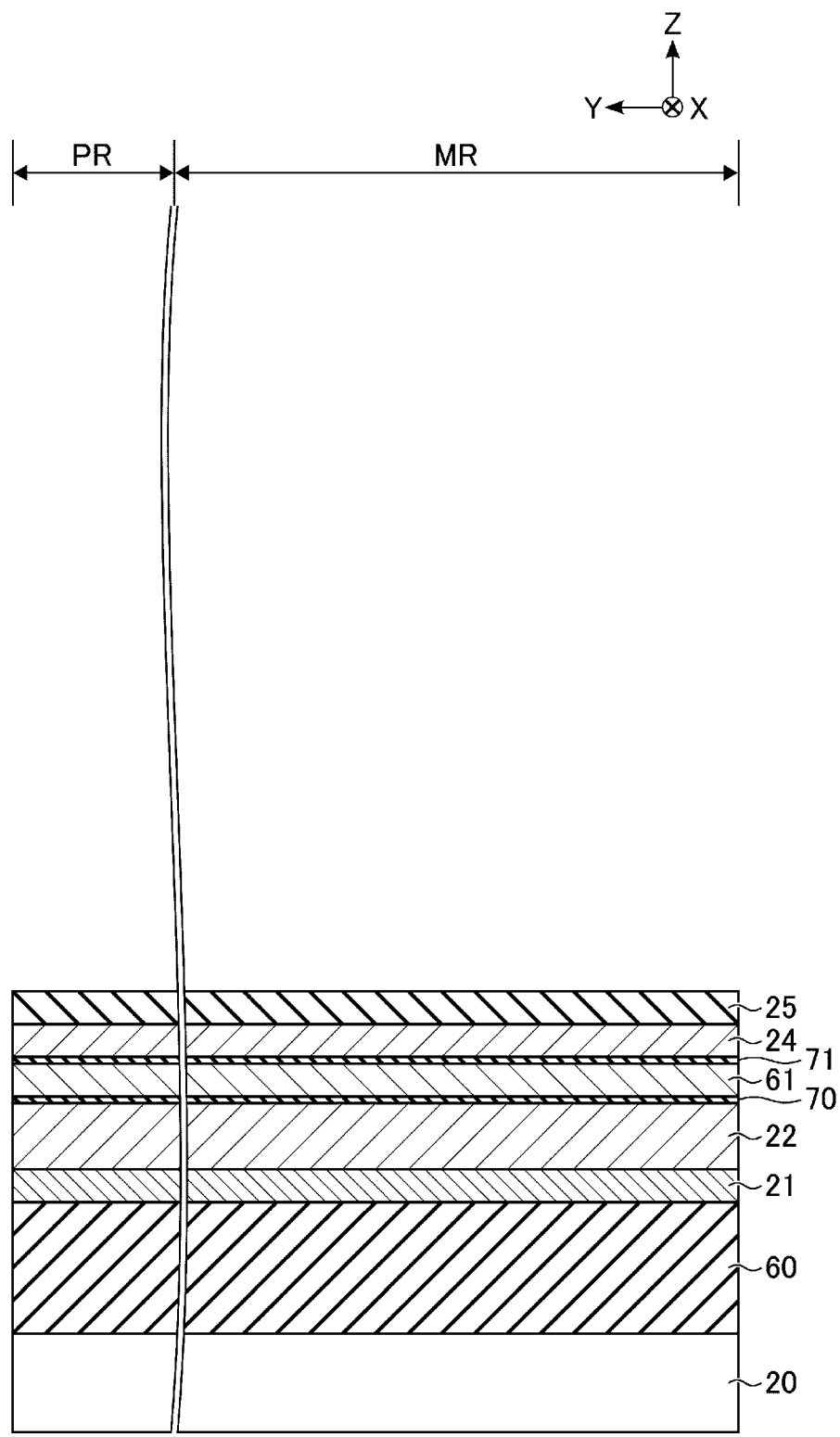
FIGS. 26-32 illustrate a cross-sectional view of a memory cell array to illustrate an example of a manufacturing process of the semiconductor memory according to the second embodiment.

First, in Step S10, a source line portion is stacked as illustrated in FIG. 26. Specifically, the interlayer insulating film 60 is formed on the semiconductor substrate 20, and the conductor 21 is formed on the interlayer insulating film 60. Then, the conductor 22, the thin film 70, the sacrificial member 61, the thin film 71, the conductor 24, and the insulating layer 25 are stacked in order on the conductor 21.

Figure 27:
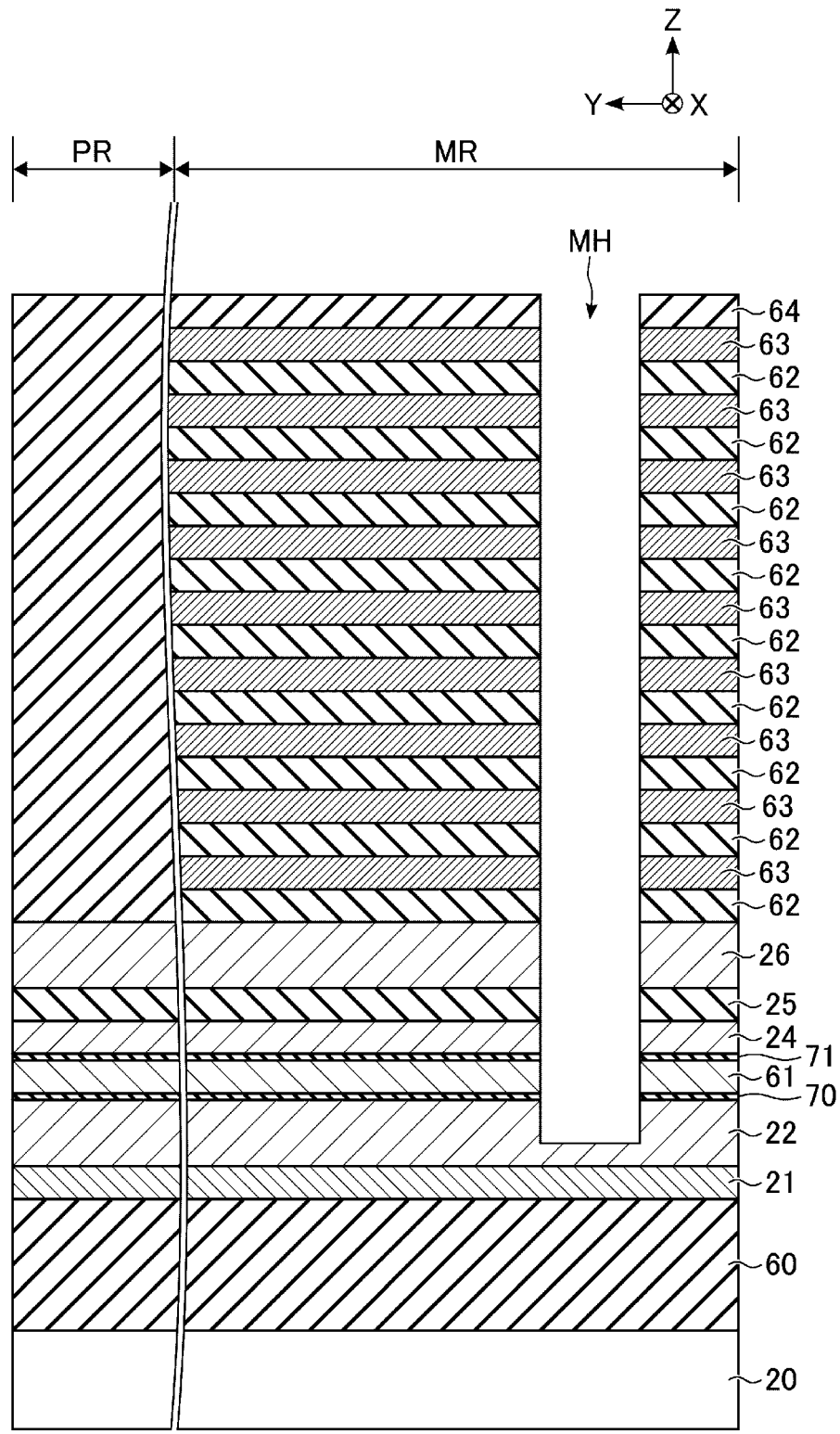

Next, processing of steps S11 to S13 is executed in order. Briefly, the conductor 26 is formed on the insulating layer 25, and the insulating layer 62 and the replacement member 63 are alternately stacked thereon. Thereafter, the drawing region HR is processed, and the insulating film 64 is formed. Then, as illustrated in FIG. 27, the memory hole MH is formed.

In this process, the memory hole MH is formed so as to reach the conductor 22 from the upper surface of the insulating film 64 similarly as in the first embodiment. That is, in this step, the memory hole MH penetrates the insulating film 64, the plurality of replacement members 63, the plurality of insulating layers 62, the conductor 26, the insulating layer 25, the thin film 71, the conductor 24, the sacrificial member 61, and the thin film 70. Then, the bottom of the memory hole MH stops in the layer in which the conductor 22 is formed, for example.

Figure 28:
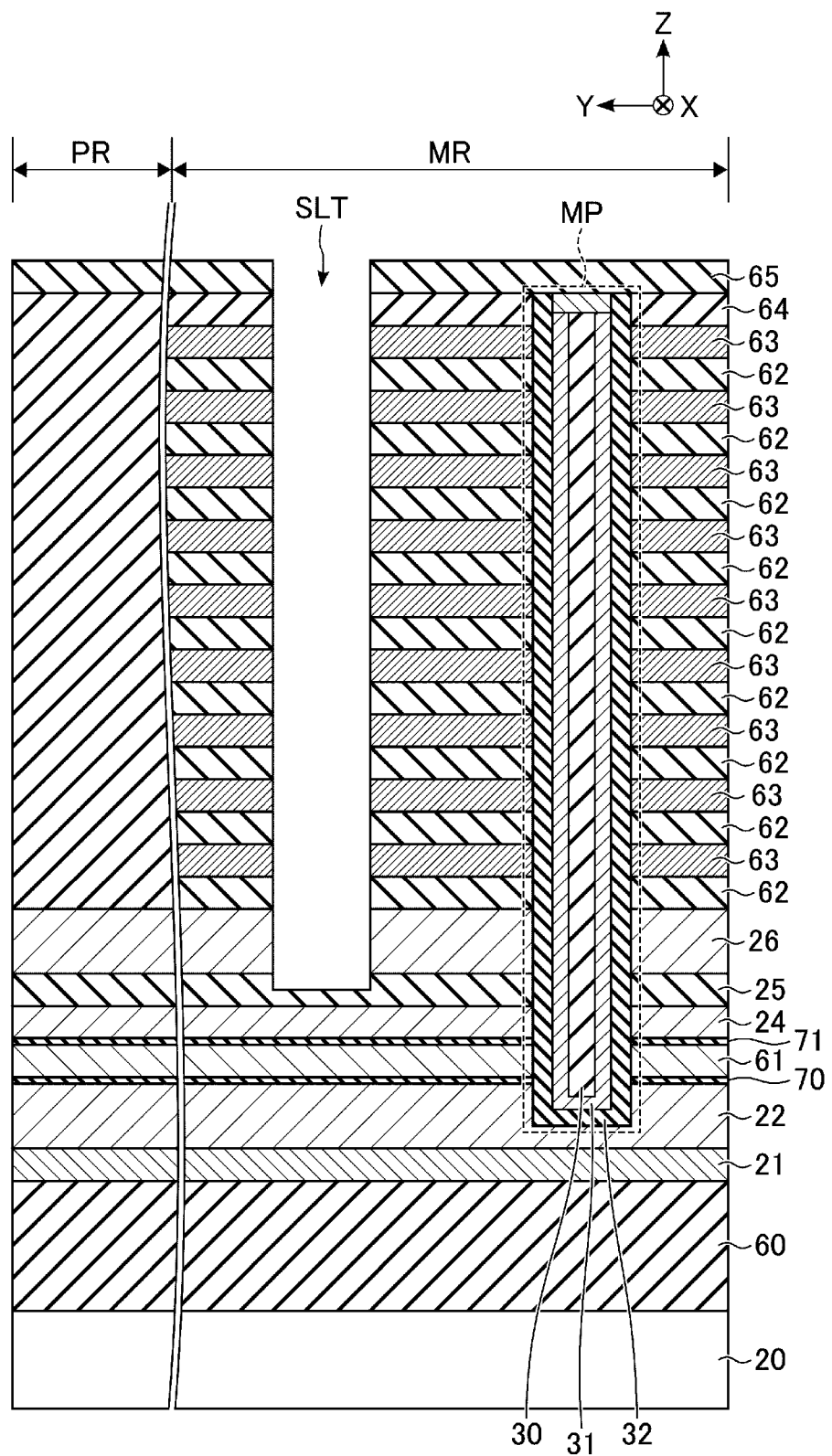

Next, processing of Steps S14 to S16 is executed in order. Briefly, the memory pillar MP is formed inside the memory hole MH. Thereafter, the protective film 65 is formed on each of the upper surface of the insulating film 64 and the upper surface of the memory pillar MP. Then, as illustrated in FIG. 28, the slit SLT is formed.

Next, processing of Steps S17 and S18 is executed. Briefly, the spacers 66 are formed on each of the upper surface of the protective film 65 and the inner wall of the slit SLT. Then, the spacer 66 formed on the upper surface of the protective film 65 and the spacer 66 formed on the bottom of the slit SLT are removed by, for example, RIE.

Figure 29:
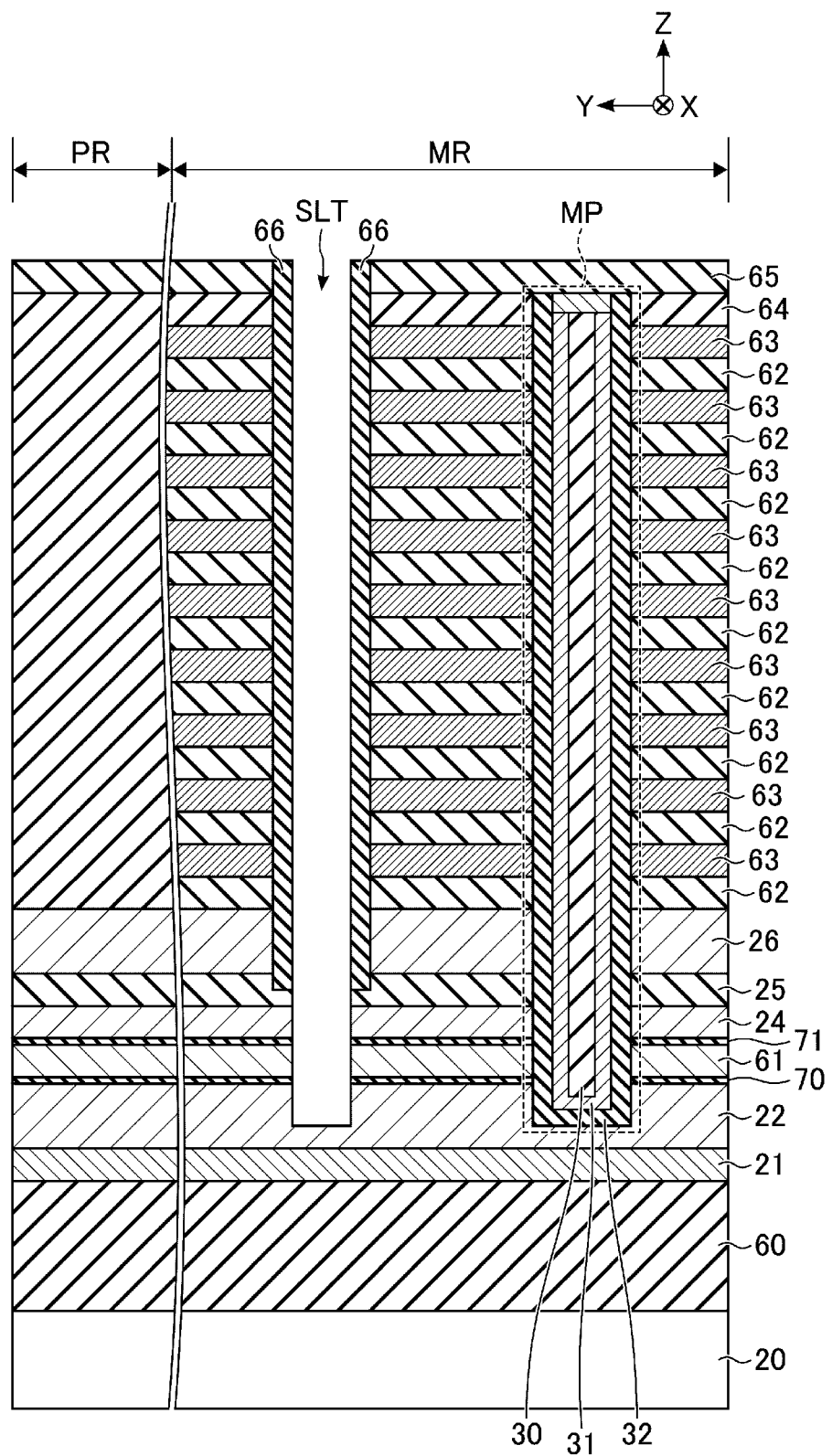

Etching in this step is continued even after the spacer 66 formed at the bottom of the slit SLT is removed. By the etching, the bottom of the slit SLT reaches, for example, the layer in which the conductor 22 is formed, as illustrated in FIG. 29.

That is, the slit SLT penetrates the protective film 65, the insulating film 64, the plurality of replacement members 63, the plurality of insulating layers 62, the conductor 26, the insulating layer 25, the thin film 71, the conductor 24, the sacrificial member 61, and the thin film 70. Then, the bottom of the slit SLT stops in the layer in which the conductor 22 is formed, for example.

Figure 30:
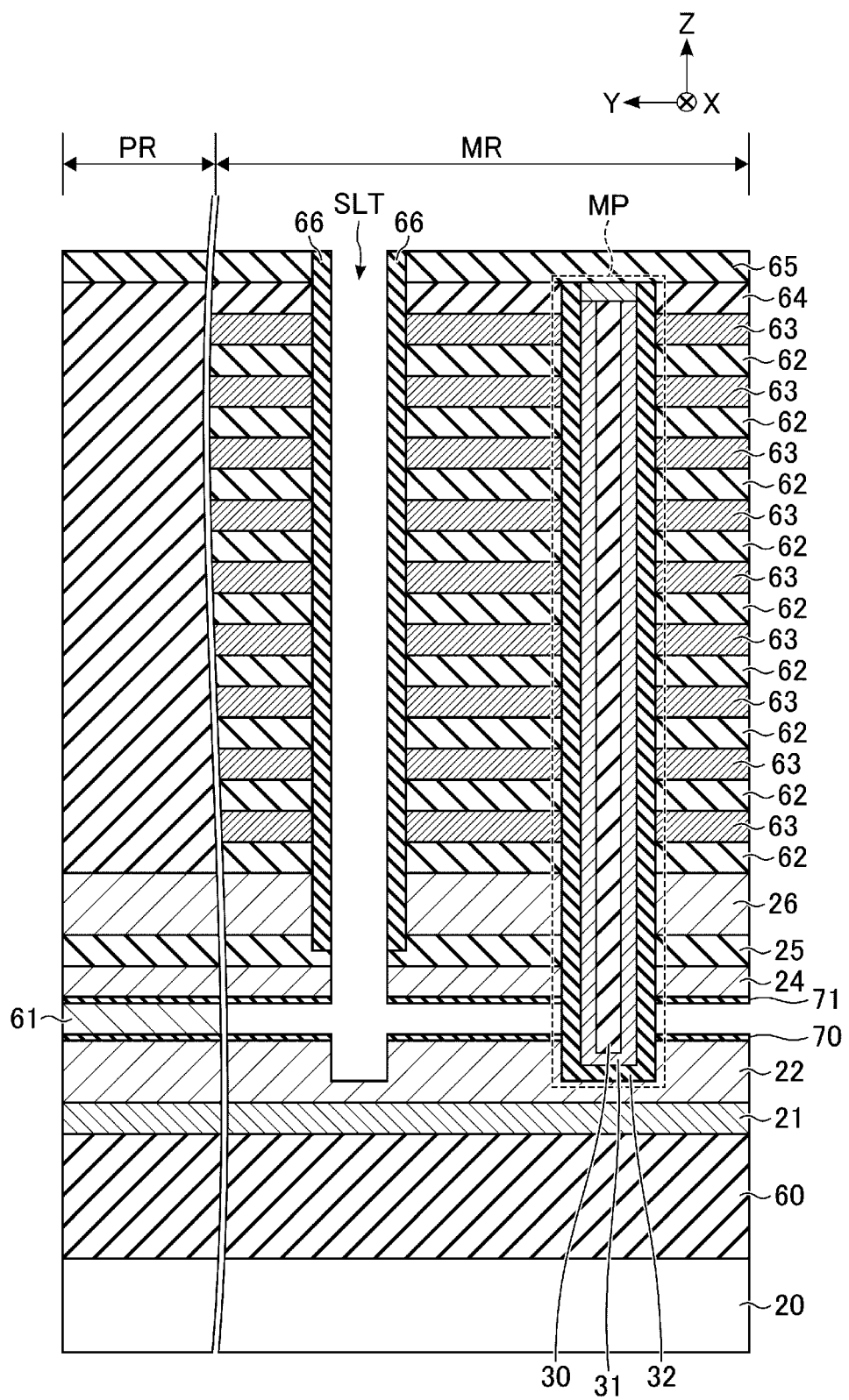

Next, processing of Step S19 is executed, and the sacrificial member 61 is removed as illustrated in FIG. 30. Similarly as in the first embodiment, the sacrificial member 61 may remain without being removed in the peripheral region PR.

Figure 31:
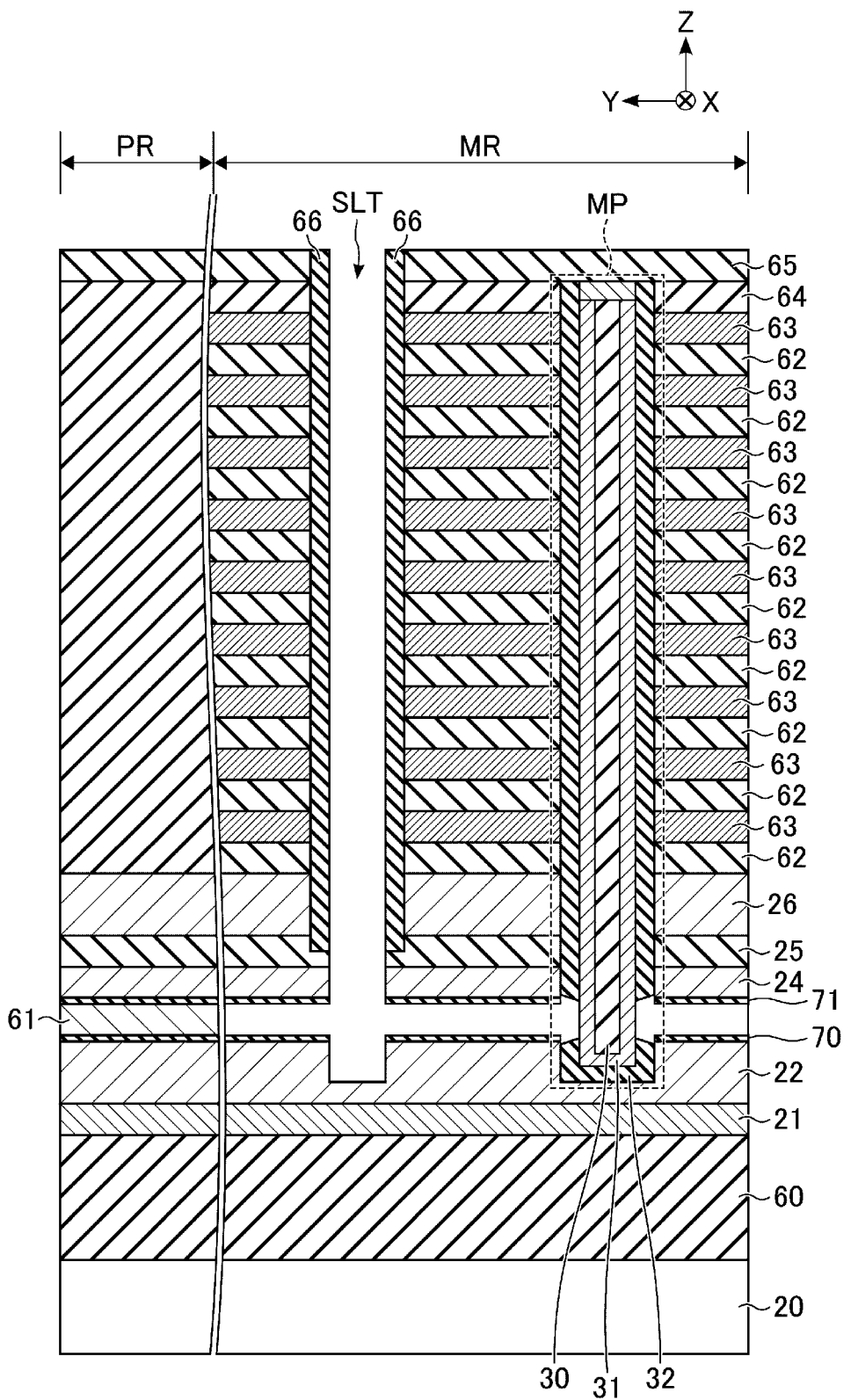

Next, processing of Step S20 is executed, and the stacked film 32 at the bottom of the memory pillar MP is removed, as illustrated in FIG. 31. In FIG. 31, an example where the thin films 70 and 71 remain after processing of this step is shown. The thin films need not remain; the thin films 70 and 71 in the memory region MR may be removed by etching in this step.

Figure 32:
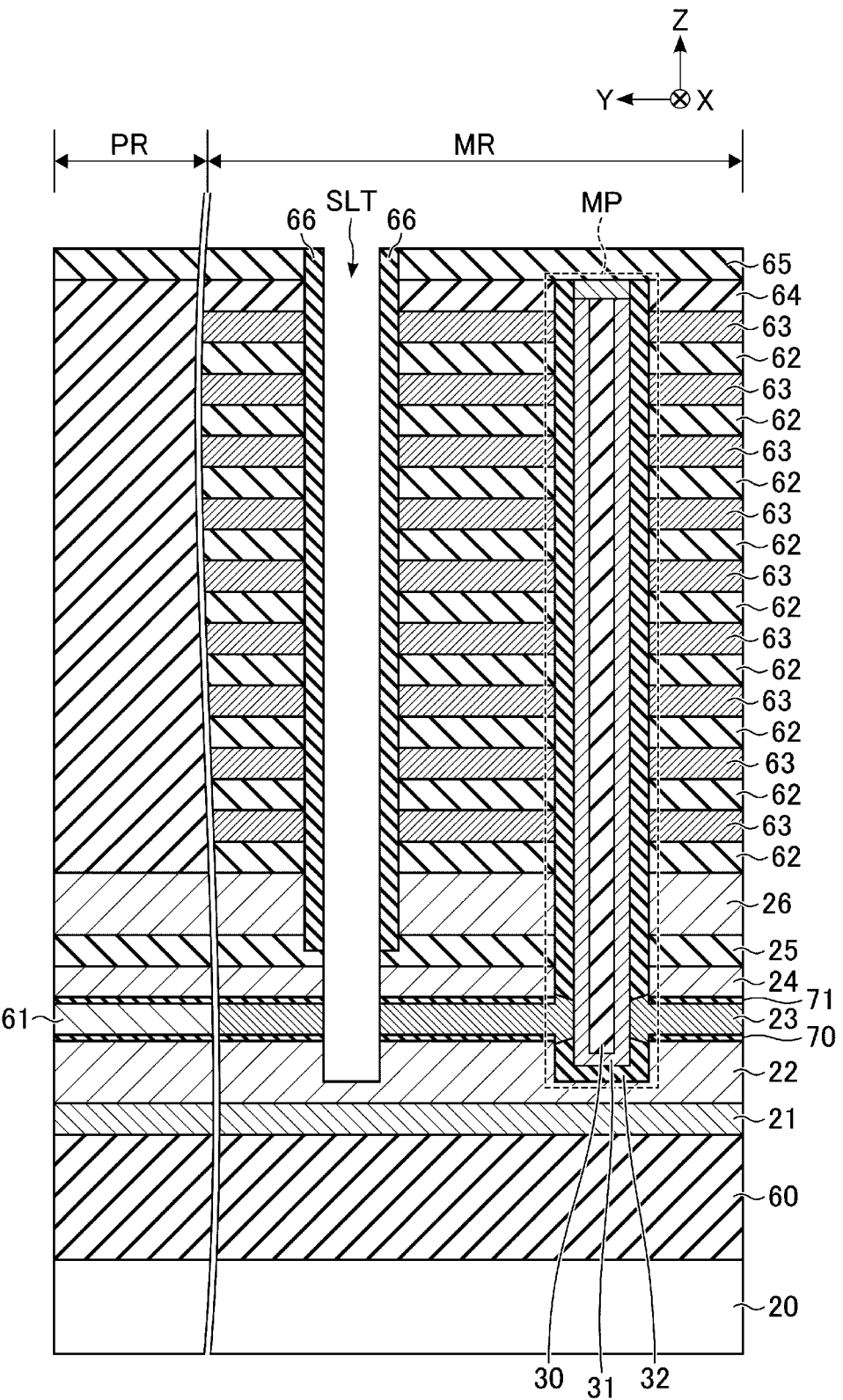

Next, processing of Step S21 is executed, and the semiconductor 23 is formed as illustrated in FIG. 32. Details of the manufacturing process of the semiconductor memory 1 according to the second embodiment and other manufacturing processes are the same as those of the first embodiment, and thus, description thereof will be omitted.

[2-3] Effects of Second Embodiment

As described above, in the manufacturing process of the semiconductor memory 1 according to the second embodiment, the thin film 70 is provided between the conductor 22 and the sacrificial member 61, and the thin film 71 is provided between the conductor 24 and the sacrificial member 61, as opposed to the manufacturing process of the semiconductor memory 1 described in the first embodiment.

The thin film 70 can prevent diffusion of impurities between the conductor 22 and the sacrificial member 61 in heat treatment. The thin film 71 can prevent diffusion of impurities between the conductor 24 and the sacrificial member 61 in heat treatment.

With this configuration, in the manufacturing process of the semiconductor memory 1 according to the second embodiment, impurity concentrations of the conductors 22 and 24 and the sacrificial member 61 are less likely to change in a period from formation of the source line portion to formation of the conductor 23.

As a result, in the method for manufacturing the semiconductor memory 1 according to the second embodiment, the etching rate of each of the conductors 22 and 24 and the sacrificial member 61 can be more uniform, and shape of the source line portion can be more uniform. Accordingly, in the method for manufacturing the semiconductor memory 1 according to the second embodiment, it is possible to prevent occurrence of defects caused by contact of the source line SL, and it is possible to improve the yield.

[3] Third Embodiment

The semiconductor memory 1 according to a third embodiment is different from the first embodiment in the stacked structure of the source line portion. In the following, differences of the semiconductor memory 1 according to the third embodiment from the first and second embodiments will be described.

[3-1] Structure of Memory Cell Array 10

Figure 33:
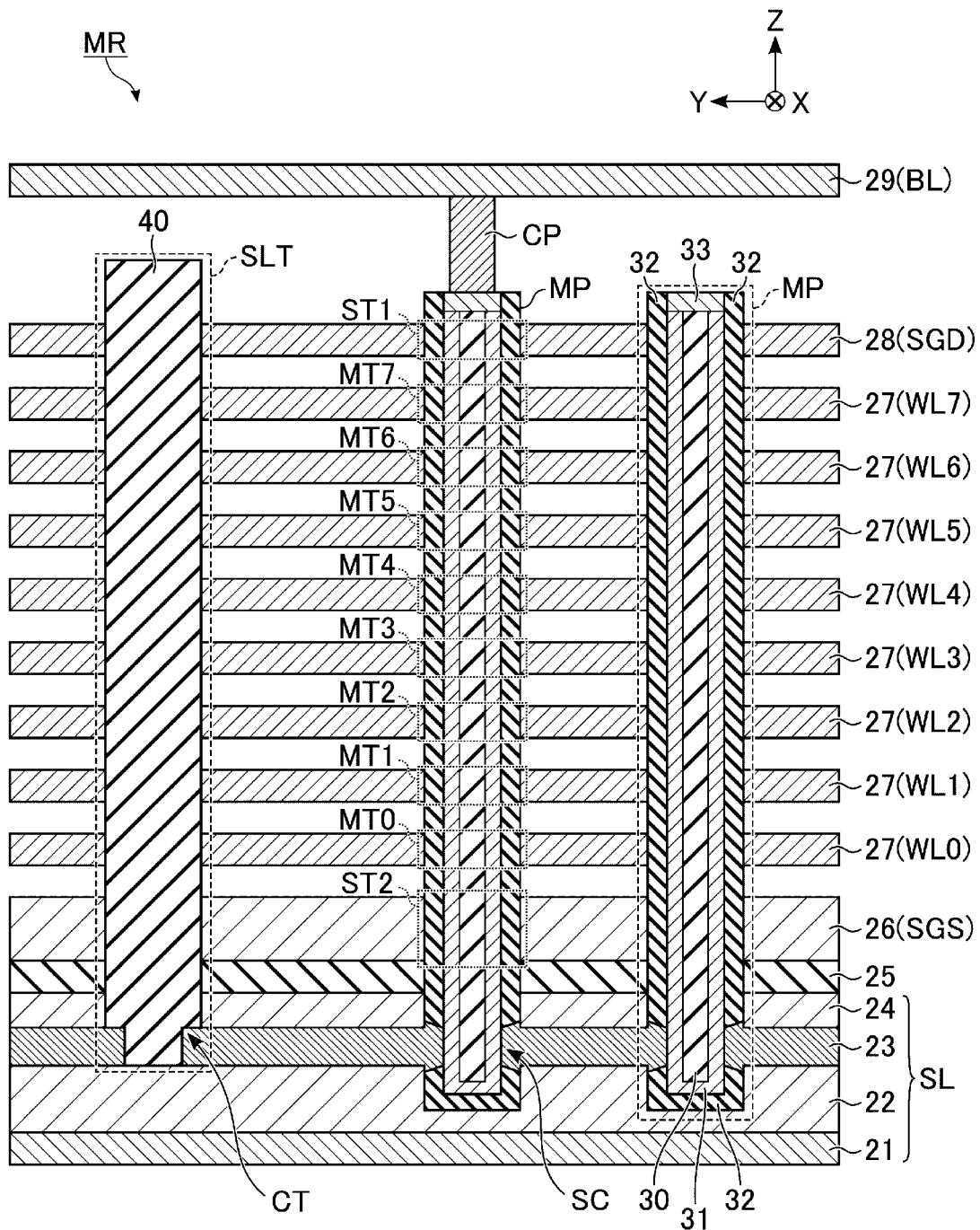
FIG. 33 illustrates a cross-sectional view of an example of a cross-sectional structure in a memory region of a memory cell array in a semiconductor memory according to a third embodiment.

FIG. 33 illustrates an example of the cross-sectional structure in the memory region MR of the memory cell array 10 in the third embodiment by extracting the region similar to FIG. 5 described in the first embodiment.

As illustrated in FIG. 33, the memory cell array 10 in the third embodiment has a structure in which an insulating film 80 is provided between the conductors 22 and 23 and an insulating film 81 is provided between the conductors 23 and 24, in the memory cell array 10 in the first embodiment described with reference FIG. 5.

The insulating films 80 and 81 are insulators such as silicon dioxide ($SiO_2$) and silicon nitride (SiN), for example. The same material or different materials may be used for the insulating films 80 and 81. Each of the insulating films 80 and 81 may contain impurities contained in the semiconductor layer which is in contact therewith. The film thickness of the insulating film 80 and the film thickness of the insulating film 81 may be the same or different.

In the memory cell array 10 according to the third embodiment, the position of the step portion CT of the slit SLT is different from that of the memory cell array 10 in the first embodiment. Specifically, in the third embodiment, the step portion CT of the slit SLT is in contact with the conductor 23. In other words, the step portion CT is included in the layer in which the conductor 23 is formed.

The other structures of the semiconductor memory 1 according to the third embodiment are the same as that of the first embodiment, and thus description thereof will be omitted.

[3-2] Manufacturing Method of Semiconductor Memory 1

The method for manufacturing the semiconductor memory 1 according to the third embodiment is the same as the flowchart described with reference to FIG. 9 in the first embodiment, for example. Each of FIGS. 34 to 40 illustrates an example of a cross-sectional structure of a structure formed in the memory region MR in the manufacturing process of the semiconductor memory 1 according to the third embodiment.

Hereinafter, points of the method for manufacturing the semiconductor memory 1 according to the third embodiment that are different from the first embodiment will be described with reference to FIG. 9 and FIGS. 34 to 40.

Figure 34:
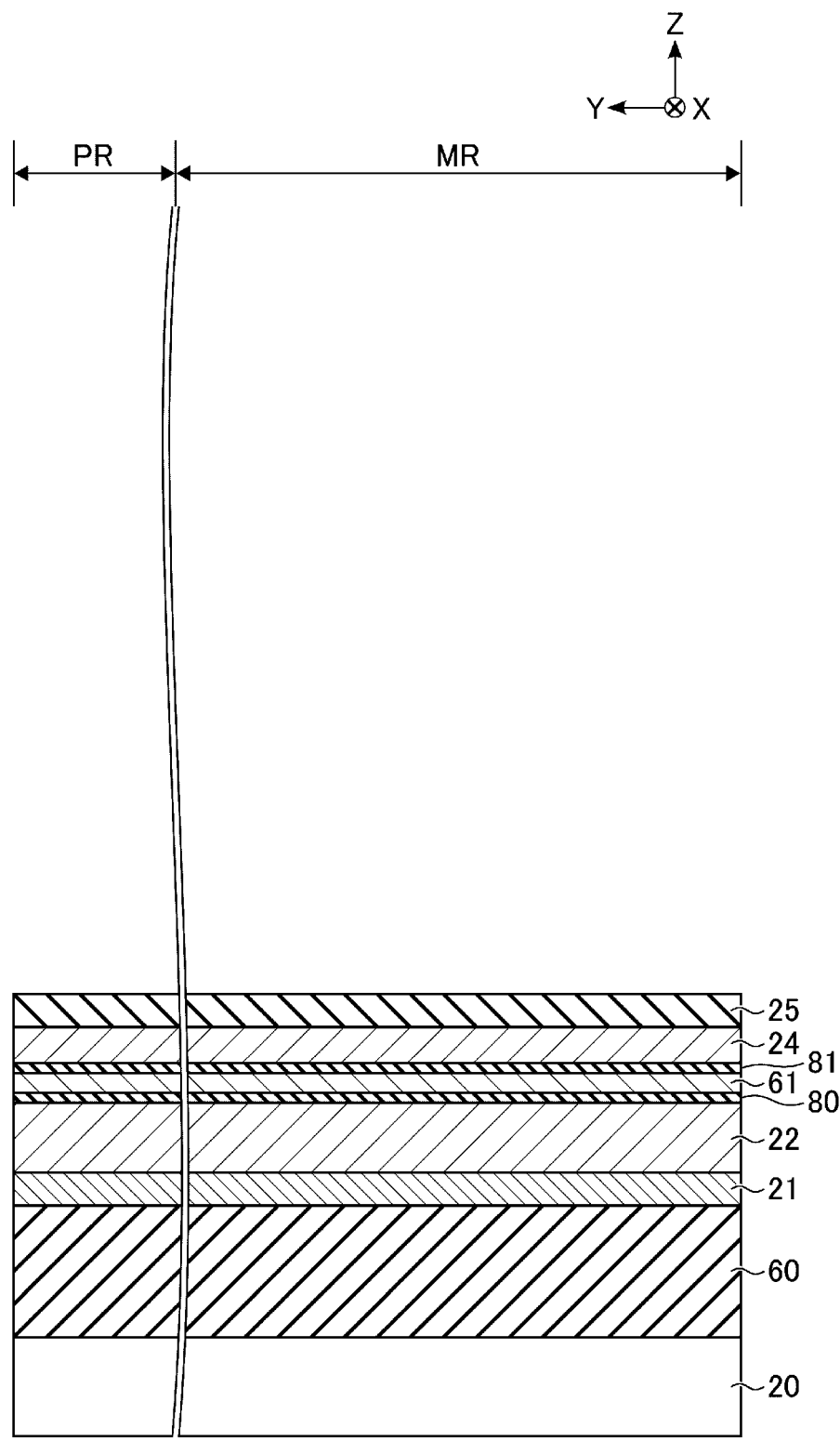
FIGS. 34-40 illustrate a cross-sectional view of a memory cell array to illustrate an example of a manufacturing process of the semiconductor memory according to the third embodiment.

First, in Step S10, the source line portion is stacked as illustrated in FIG. 34. Specifically, the interlayer insulating film 60 is formed on the semiconductor substrate 20, and the conductor 21 is formed on the interlayer insulating film 60. Then, the conductor 22, the insulating film 80, the sacrificial member 61, the insulating film 81, the conductor 24, and the insulating layer 25 are stacked in this order on the conductor 21.

Figure 35:
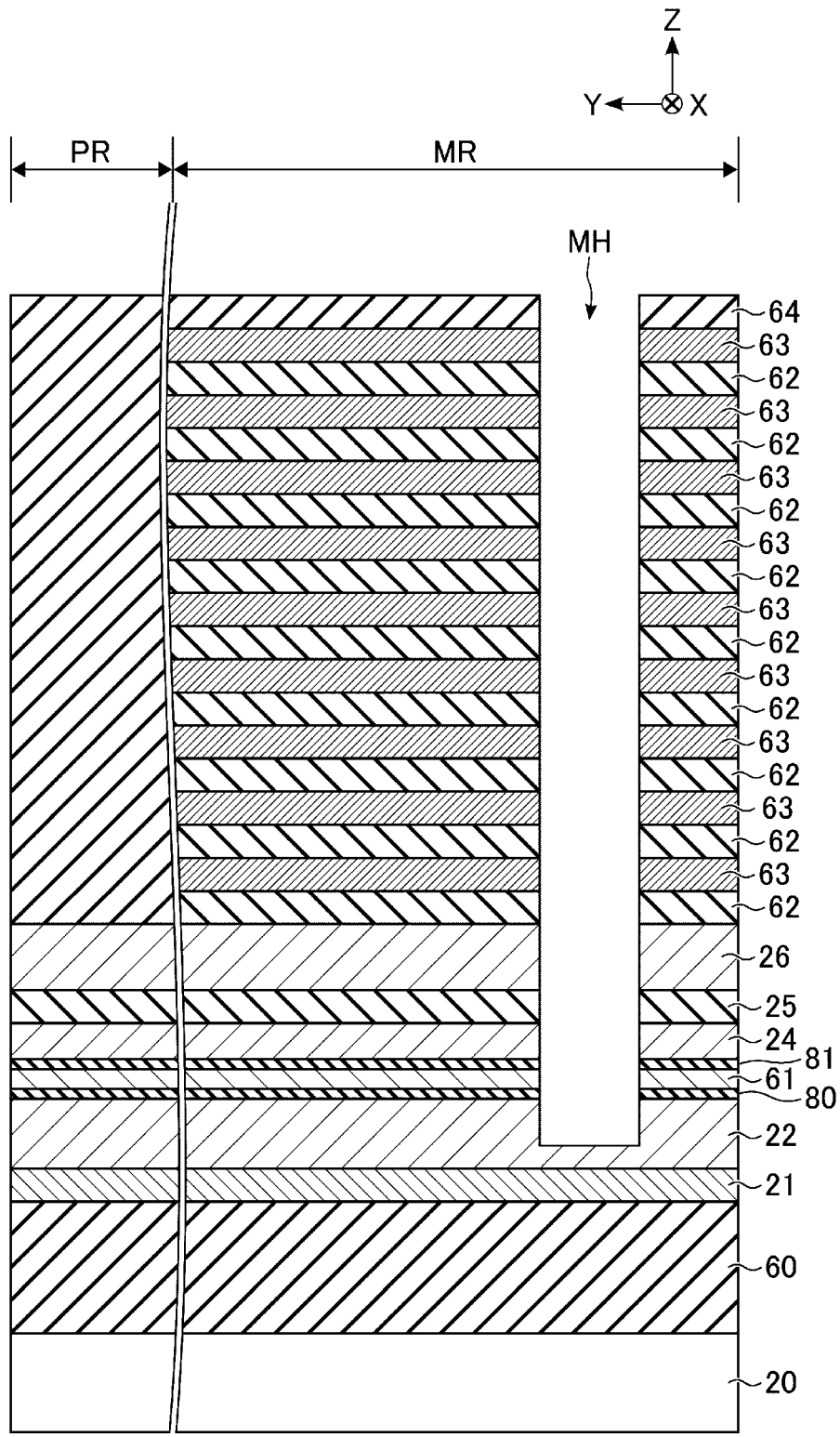

Next, processing of Steps S11 to S13 is executed in order. Briefly, the conductor 26 is formed on the insulating layer 25, and the insulating layer 62 and the replacement member 63 are alternately stacked thereon. Thereafter, the drawing region HR is processed, and the insulating film 64 is formed. Then, as illustrated in FIG. 35, the memory hole MH is formed.

In this process, the memory hole MH is formed so as to reach the conductor 22 from the upper surface of the insulating film 64, similar to the first embodiment. That is, in this step, the memory hole MH penetrates the insulating film 64, the plurality of replacement members 63, the plurality of insulating layers 62, the conductor 26, the insulating layer 25, the insulating film 81, the conductor 24, the sacrificial member 61, and the insulating film 80. Then, the bottom of the memory hole MH stops in the layer in which the conductor 22 is formed, for example.

Figure 36:
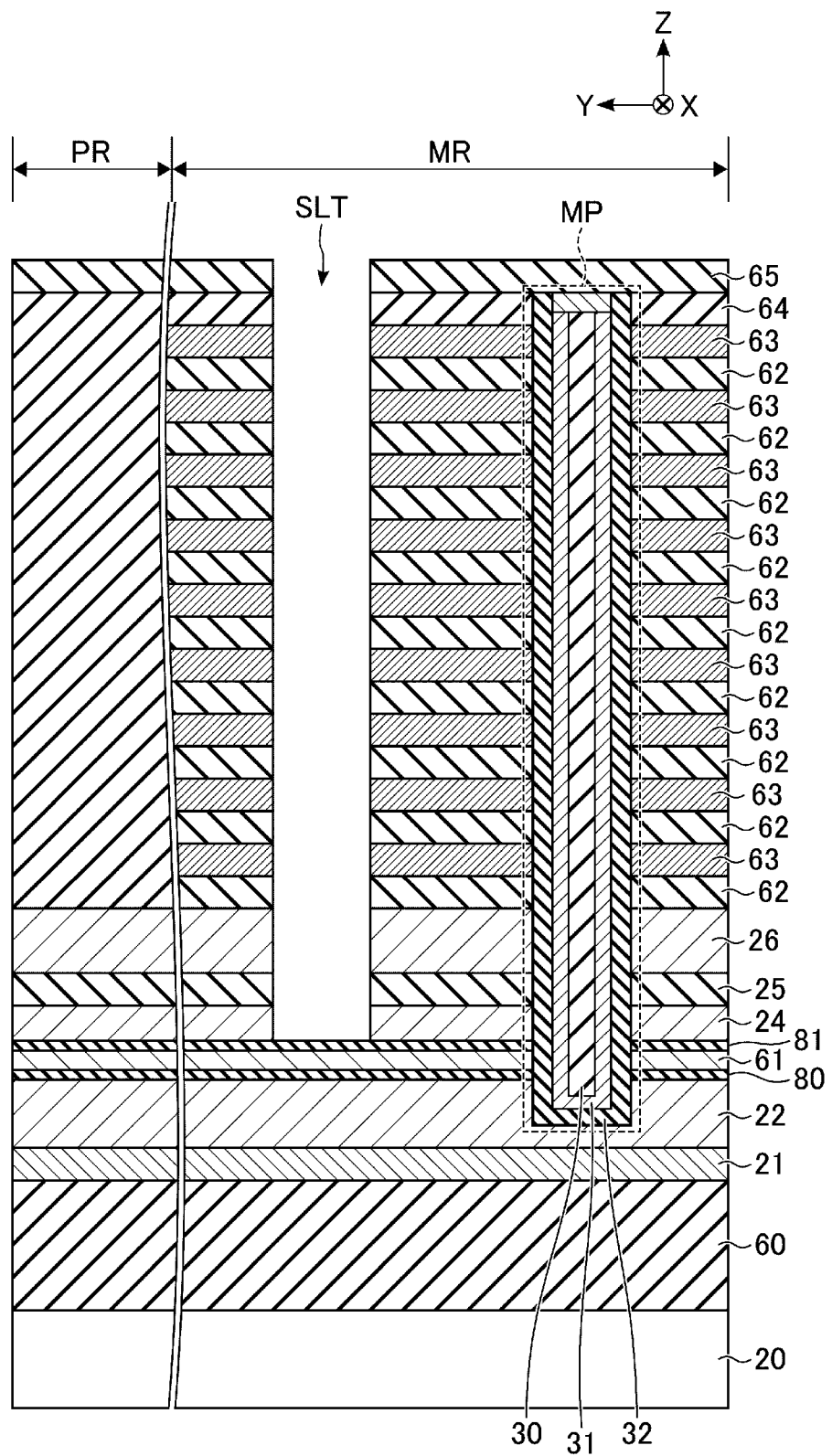

Next, processing of steps S14 to S16 is executed in order. Briefly, the memory pillar MP is formed inside the memory hole MH. Thereafter, the protective film 65 is formed on each of the upper surface of the insulating film 64 and the upper surface of the memory pillar MP. Then, as illustrated in FIG. 36, the slit SLT is formed.

In this process, the slit SLT is formed so as to reach the insulating film 81 from the upper surface of the protective film 65. That is, in this step, the slit SLT penetrates the protective film 65, the insulating film 64, the plurality of replacement members 63, the plurality of insulating layers 62, the conductor 26, the insulating layer 25, the insulating film 81, and the conductor 24. Then, the bottom of the slit SLT stops in the layer in which the insulating film 81 is formed.

Next, processing of steps S17 and S18 is executed. Briefly, spacers 66 are formed on the upper surface of the protective film 65 and the inner walls of the slit SLT. Then, the spacer 66 formed on the upper surface of the protective film 65 and the spacer 66 formed on the bottom of the slit SLT are removed by, for example, RIE.

Figure 37:
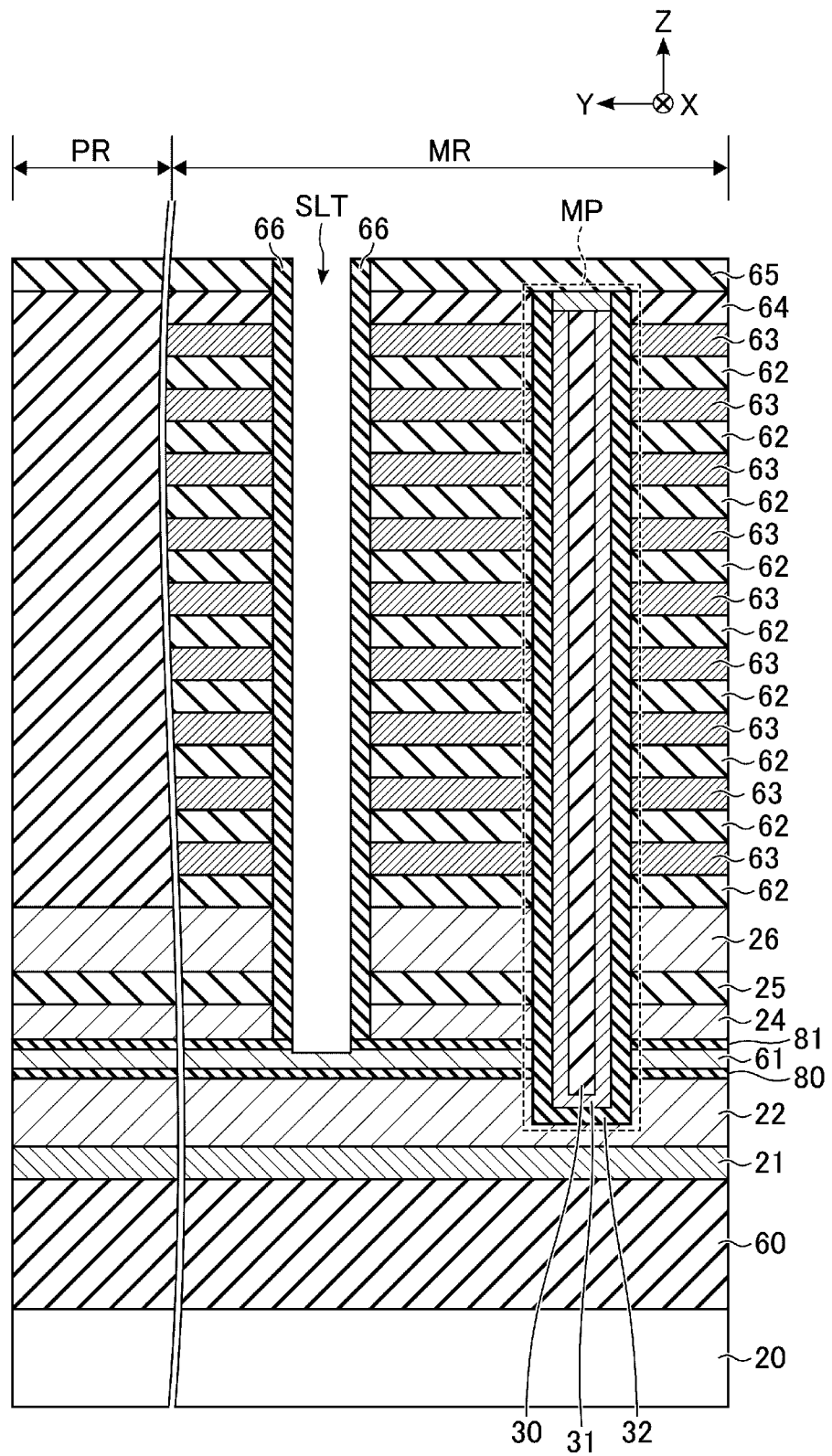

Etching in this step is continued even after the spacer 66 formed at the bottom of the slit SLT is removed. By this etching, the bottom of the slit SLT reaches, for example, the layer where the sacrificial member 61 is formed, as illustrated in FIG. 37. That is, the bottom of the slit SLT stops in the layer in which the sacrificial member 61 is formed.

Figure 38:
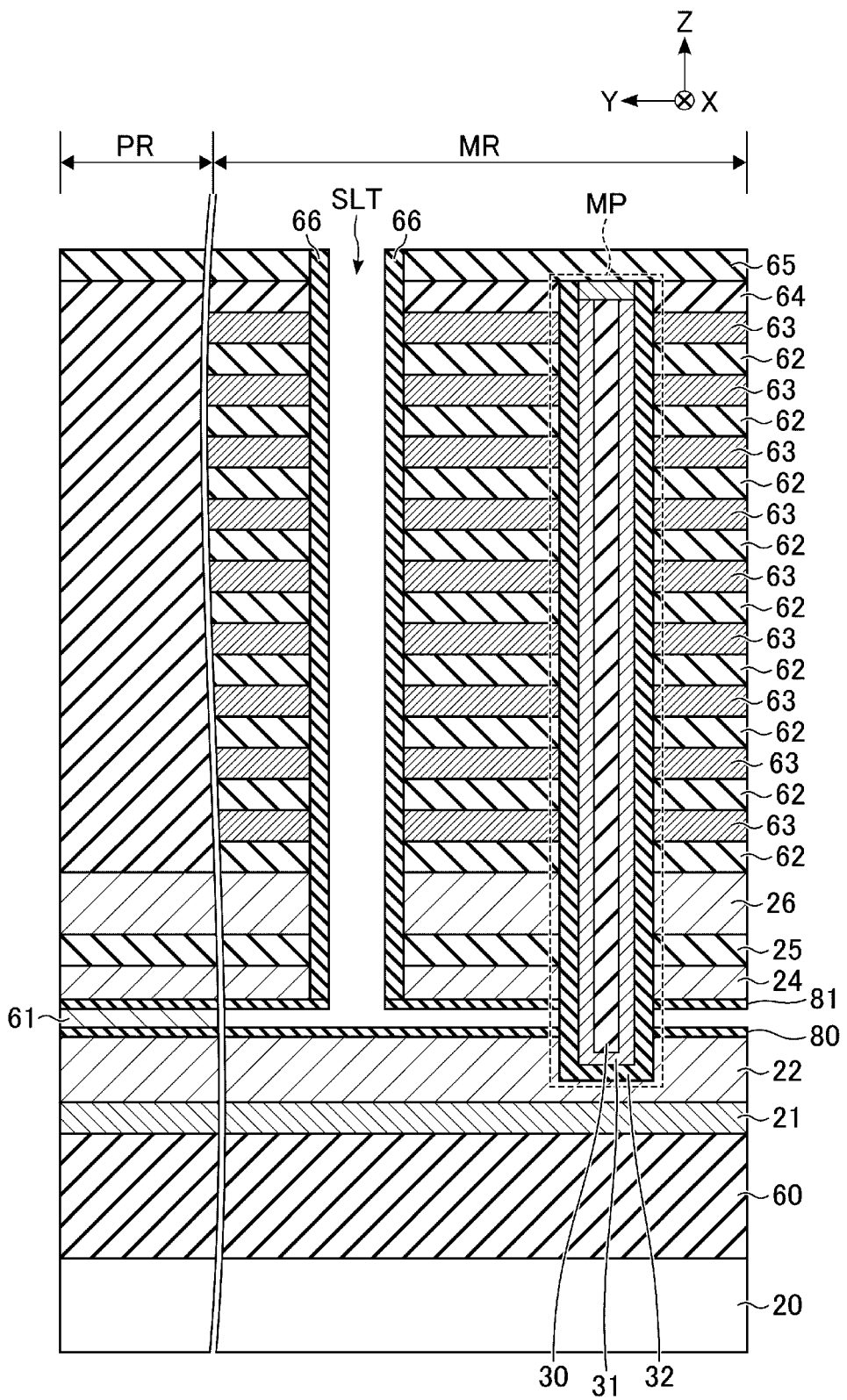

Next, processing of Step S19 is executed, and the sacrificial member 61 is removed as illustrated in FIG. 38. Similarly as in the first embodiment, the sacrificial member 61 may remain without being removed in the peripheral region PR.

Figure 39:
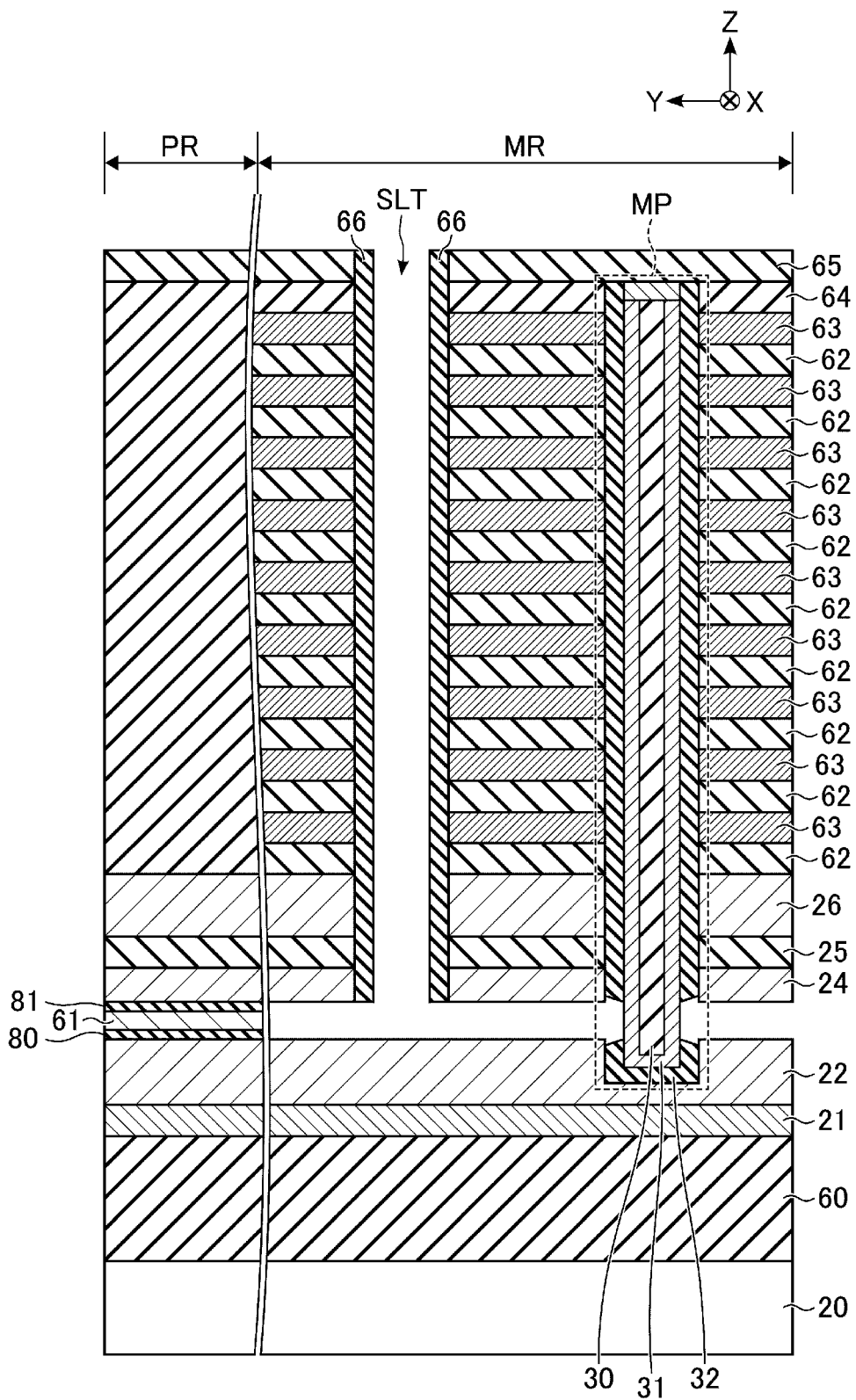

Next, processing of Step S20 is executed, and the stacked film 32 at the bottom of the memory pillar MP is removed as illustrated in FIG. 39. In etching of this step, the insulating films 80 and 81 formed in the memory region MR are also removed.

Figure 40:
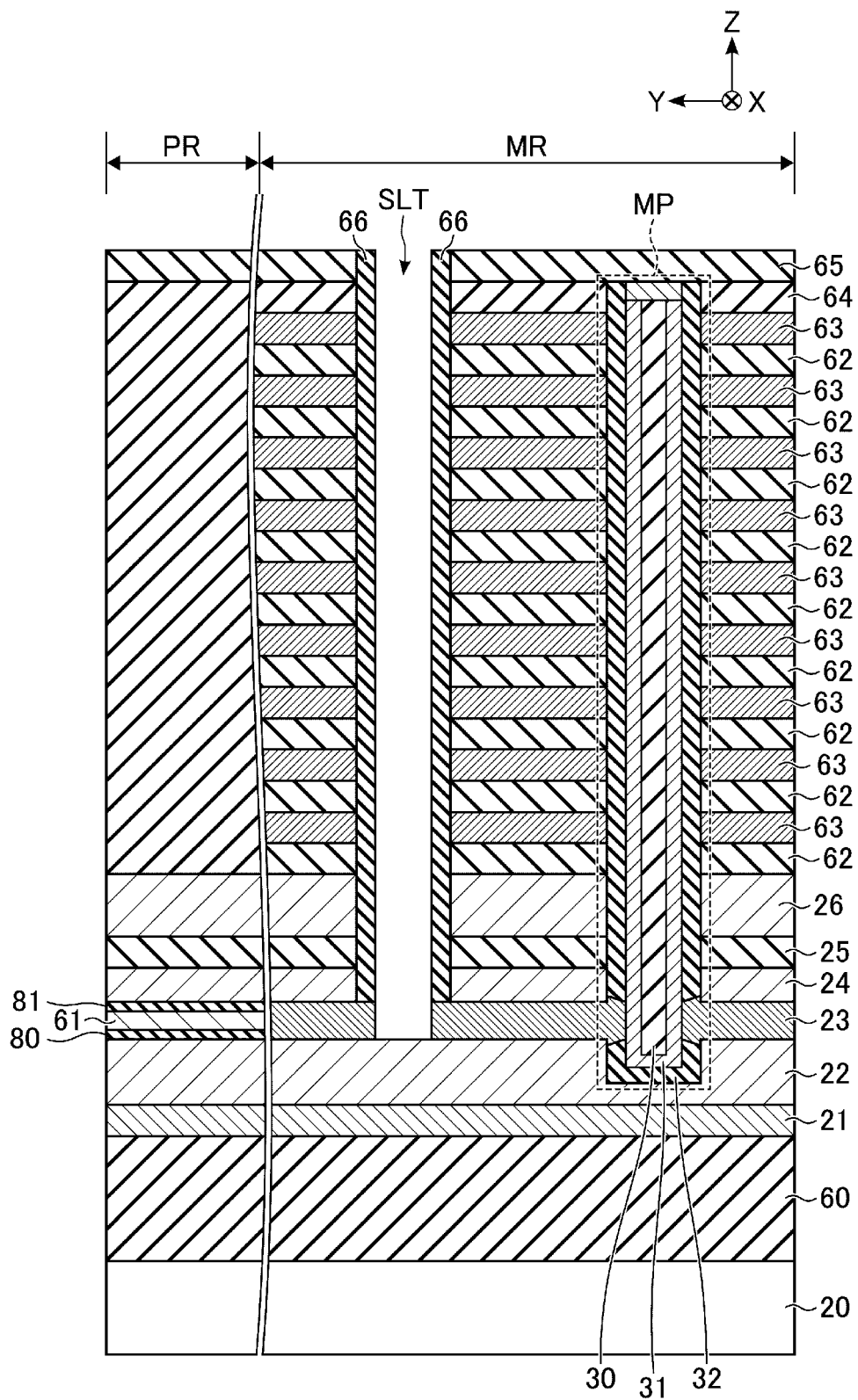

Next, processing of Step S21 is executed, and the semiconductor 23 is formed as illustrated in FIG. 40. Details of the manufacturing process of the semiconductor memory 1 according to the third embodiment and other manufacturing processes are the same as those of the first embodiment, and thus description thereof will be omitted.

[3-3] Effects of Third Embodiment

As described above, in the manufacturing process of the semiconductor memory 1 according to the third embodiment, the insulating film 80 is provided between the conductor 22 and the sacrificial member 61, and the insulating film 81 is provided between the conductor 24 and the sacrificial member 61, as opposed to the manufacturing process of the semiconductor memory 1 described in the first embodiment.

The insulating film 80 prevents diffusion of impurities between the conductor 22 and the sacrificial member 61 in heat treatment and protects the conductor 22 in the process of removing the sacrificial member 61. The insulating film 81 prevents diffusion of impurities between the conductor 24 and the sacrificial member 61 in heat treatment and protects the conductor 24 in the process of removing the sacrificial member 61.

That is, in the semiconductor memory 1 according to the third embodiment, impurity concentration of each of the conductors 22 and 24 and the sacrificial member 61 is less likely to change and the shapes of the conductors 22 and 24 are maintained in the manufacturing process from formation of the source line portion to formation of the semiconductor 23.

As a result, in the method for manufacturing the semiconductor memory 1 according to the third embodiment, it is possible to prevent variation in the shape of the source line portion. Accordingly, in the method for manufacturing the semiconductor memory 1 according to the third embodiment, it is possible to prevent occurrence of defects caused by contact of the source line SL, and it is possible to improve the yield.

In the manufacturing process of the semiconductor memory 1 according to the third embodiment, the insulating film 81 is used as an etching stopper when forming the slit SLT in Step S16.

With this configuration, in the manufacturing process of the semiconductor memory 1 according to the third embodiment, it is possible to prevent variation in the amount of encroachment into the sacrificial member 61 at the bottom surface of the slit SLT in the step of causing the bottom of the slit SLT to reach the sacrificial member 61 in step S18.

As a result, in the semiconductor memory 1 according to the third embodiment, it is possible to prevent occurrence of embedding failure of the conductor 23, which can occur when the region in which the spacer 66 is formed reaches the layer where the sacrificial member 61 is formed. That is, in the method for manufacturing the semiconductor memory 1 according to the third embodiment, it is possible to stably form the conductor 23, and the yield can be increased.

[4] Modification Example and the like

The semiconductor memory according to the embodiments includes a stacked portion <for example, 10 in FIG. 3> and a plurality of pillars <for example, MP in FIG. 3>. The stacked portion includes a first region <for example, MR in FIG. 24> and a second region <for example, PR in FIG. 24> different from the first region, in a plane parallel to the surface of the substrate. The stacked portion includes a first conductive layer <for example, 22 to 24 and 61 in FIG. 24>, a first insulating layer <for example, 25 in FIG. 24> on the first conductive layer, and a second conductive layer <for example, 26 in FIG. 24> on the first insulating layer, in the first region and the second region. In the first region, the stacked portion includes a second insulating layer <for example, 62 in FIG. 24> and a third conductive layer <for example, 27 in FIG. 24> alternately stacked on the second conductive layer. The plurality of pillars penetrate the second insulating layer and the third conductive layer that are stacked, the second conductive layer, and the first insulating layer in the first region of the stacked portion, and the bottom surfaces of the plurality of pillars are included in the first conductive layer. A portion where the plurality of pillars and the first conductive layer cross each other functions as the memory cell. The carrier density of the first conductive layer in the first region is higher than the carrier density of the first conductive layer in the second region. With this configuration, the yield of the semiconductor memory 1 can be increased.

In the embodiments described above, description is made assuming that adjacent semiconductor layers (conductive layers) can be distinguished, but is not limited thereto. For example, in the adjacent semiconductor layer, diffusion of impurities by heat treatment during the manufacturing process of the semiconductor memory 1 may cause the boundaries of the conductors 22 to 24 to be unknown.

Even in such a case, a difference in carrier density may occur between the semiconductor layer within the source line portion in the memory region MR and the semiconductor layer within the source line portion in the peripheral region PR. That is, in the manufacturing process of the semiconductor memory 1, it is considered that the carrier density of the semiconductor layer of the source line portion is different depending on whether the sacrificial member 61 of the source line portion remains or the sacrificial member 61 is replaced with the conductor 23.

For example, phosphorus doped polysilicon is formed as the conductor 23 in the memory region MR, and silicon germanium remains as the sacrificial member 61 in the peripheral region PR. For that reason, when carriers are diffused between the semiconductor layers of the source line portion in the manufacturing process of the semiconductor memory 1, electron density in the memory region MR of the semiconductor layer becomes higher than electron density in the peripheral region PR. This is the same for any of the first to eighth combinations described in [1-3].

In the embodiments described above, although the example case where the diameter of the memory pillar MP is constant at each position in the Z-direction is presented, the shape of the memory pillar MP is not limited thereto. For example, the cross-sectional shape of the memory pillar MP may be a shape in which the memory pillar MP is bulging in the middle, a tapered shape in which the diameter thereof increases toward the substrate side, or an inverse taper shape in which the diameter thereof increases toward the substrate side.

Similarly, although the case where the width of the slit SLT formed in Step S16 is constant at each position in the Z-direction is illustrated, the shape of the slit SLT is not limited thereto. For example, the cross-sectional shape of the slit SLT may be a shape in which the slit SLT is bulging in the middle, a tapered shape in which the diameter thereof increases toward the substrate side, or an inverse taper shape in which the diameter thereof increases toward the substrate side.

In the present specification, the term "connection" means that it is electrically connected and does not exclude, for example, connection through another element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor memory comprising:
a semiconductor substrate;

a control circuit provided on the semiconductor substrate in a first region and a second region;

a first layer provided above the control circuit in the first region and the second region, the first layer in the first region functioning as a source line;

a stacked body including a plurality of first insulating layers and a plurality of first conductive layers alternately stacked in a first direction above the first layer in the first region, the plurality of first conductive layers not existing in the second region;

a pillar including a first semiconductor layer and extending in the first direction through the stacked body, a first end of the first semiconductor layer being provided within the source line; and a through-contact extending in the first direction through the first layer in the second region, the through-contact being electrically connected to the control circuit, wherein the first layer comprises a first portion in the first region and a second portion in the second region, the first portion includes a second semiconductor layer, a third semiconductor layer, a fourth semiconductor layer in order in the first direction, the second portion includes the second semiconductor layer, a second insulating layer, a second layer containing silicon, a third insulating layer, and the fourth semiconductor layer in order in the first direction, and the second layer is at a same layer level as the third semiconductor layer and is formed of a different material from a material of the third semiconductor layer, wherein the first portion includes the second semiconductor layer, the second insulating layer, the third semiconductor layer, the third insulating layer, and the fourth semiconductor layer in order in the first direction.

2. The semiconductor memory according to claim 1, wherein
the pillar includes a first insulator extending in the first direction,
the first semiconductor layer covers bottom and side surfaces of the first insulator, and
the source line is in contact with the side surface of the first semiconductor layer.

3. The semiconductor memory according to claim 1, further comprising:
an insulating wall extending through the stacked body in the first direction, the insulating wall also extending in a second direction along a surface of the semiconductor substrate, a bottom end of the insulating wall in the first direction being located in the first layer.

4. The semiconductor memory according to claim 1, wherein each of the second insulating layer and the third insulating layer is an oxide or a nitride.

5. The semiconductor memory according to claim 4, wherein a thickness of each of the second insulating layer and the third insulating layer is 2 nm or less.

6. The semiconductor memory according to claim 1, wherein each of the second insulating layer and the third insulating layer is an oxide or a nitride.

7. The semiconductor memory according to claim 1, wherein the second layer contains silicon germanium, and the third semiconductor layer contains doped silicon.

8. The semiconductor memory according to claim 7, wherein the third semiconductor layer contains phosphorus-doped silicon.

9. The semiconductor memory according to claim 7, wherein each of the second semiconductor layer and the fourth semiconductor layer contains carbon-doped silicon.

10. The semiconductor memory according to claim 7, wherein each of the second semiconductor layer and the fourth semiconductor layer contains nitrogen-doped silicon.

11. The semiconductor memory according to claim 7, wherein each of the second semiconductor layer and the fourth semiconductor layer contains oxygen-doped silicon.

12. The semiconductor memory according to claim 7, wherein each of the second semiconductor layer and the fourth semiconductor layer contains boron-doped silicon.

13. The semiconductor memory according to claim 1, wherein a concentration of a dopant in the second layer is less than the concentration of the dopant in the third semiconductor layer.

14. The semiconductor memory according to claim 1, wherein the dopant is phosphorus.

15. The semiconductor memory according to claim 14, wherein each of the second semiconductor layer and the fourth semiconductor layer contains carbon-doped silicon.

16. The semiconductor memory according to claim 14, wherein each of the second semiconductor layer and the fourth semiconductor layer contains nitrogen-doped silicon.

17. The semiconductor memory according to claim 14, wherein each of the second semiconductor layer and the fourth semiconductor layer contains oxygen-doped silicon.

18. The semiconductor memory according to claim 14, wherein each of the second semiconductor layer and the fourth semiconductor layer contains boron-doped silicon.

* * * * *